(12) United States Patent
Hosoi

(10) Patent No.: US 8,139,392 B2
(45) Date of Patent: Mar. 20, 2012

(54) NONVOLATILE SEMICONDUCTOR MEMORY DEVICE AND WRITING METHOD OF THE SAME

(75) Inventor: Yasunari Hosoi, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 121 days.

(21) Appl. No.: 12/525,615

(22) PCT Filed: Feb. 1, 2008

(86) PCT No.: PCT/JP2008/051654
§ 371 (c)(1),
(2), (4) Date: Aug. 3, 2009

(87) PCT Pub. No.: WO2008/096674
PCT Pub. Date: Aug. 14, 2008

(65) Prior Publication Data
US 2010/0073983 A1    Mar. 25, 2010

(30) Foreign Application Priority Data
Feb. 9, 2007    (JP) .................................. 2007-031168

(51) Int. Cl.
G11C 17/00    (2006.01)
G11C 11/00    (2006.01)
(52) U.S. Cl. ........................................ 365/148; 365/100
(58) Field of Classification Search .................. 365/148, 365/163, 46, 100
See application file for complete search history.

(56) References Cited

U.S. PATENT DOCUMENTS

| | | | |
|---|---|---|---|
| 6,078,521 A * | 6/2000 | Madurawe et al. | 365/185.18 |
| 7,184,295 B2 | 2/2007 | Tsushima et al. | |
| 2004/0114429 A1 | 6/2004 | Ehiro et al. | |
| 2004/0264244 A1 | 12/2004 | Morimoto | |
| 2006/0109704 A1 | 5/2006 | Seo et al. | |
| 2007/0037351 A1 | 2/2007 | Ahn et al. | |
| 2007/0165442 A1 * | 7/2007 | Hosoi et al. | 365/100 |

(Continued)

FOREIGN PATENT DOCUMENTS

JP    2004-185756    7/2004
(Continued)

OTHER PUBLICATIONS

International Search Report for PCT/JP2008/051654 mailed May 13, 2008.

W.W. Zhuang et al., "Novell Colossal Magnetoresistive Thin Film Nonvolatile Resistance Random Access Memory (RRAM)", Sharp Laboratories of America, IEEE 2002, 4 pages.

(Continued)

Primary Examiner — VanThu Nguyen
Assistant Examiner — Khamdan Alrobaie
(74) Attorney, Agent, or Firm — Nixon & Vanderhye P.C.

(57) ABSTRACT

A nonvolatile semiconductor memory device comprises a memory cell array composed of a plurality of memory cells each including a variable resistance element in which a resistance characteristic is changed by applying a voltage to the both ends, and information related to the resistance characteristic can be stored; a load circuit connected to one terminal of the variable resistance element in series; and a voltage generation circuit for applying a voltage to both ends of a series circuit. The variable resistance element selectively transits to one resistance characteristic selected from at least three different resistance characteristics when the voltage generated from the voltage generation circuit is applied under the transition condition set by changing any one or both of the load resistance characteristic of the load circuit and the voltage generation condition from the voltage generation circuit, and can store information having at least three values.

16 Claims, 19 Drawing Sheets

U.S. PATENT DOCUMENTS

2007/0195581 A1* 8/2007 Morimoto ............... 365/148
2008/0123393 A1 5/2008 Kinoshita
2009/0273964 A1* 11/2009 Yamazaki et al. ......... 365/148

FOREIGN PATENT DOCUMENTS

| | | |
|---|---|---|
| JP | 2005-25914 | 1/2005 |
| JP | 2005-235360 | 9/2005 |
| JP | 2006-135335 | 5/2006 |
| JP | 2006-202411 | 8/2006 |
| KR | 10-0657966 | 12/2006 |
| WO | 2006/137111 | 12/2006 |
| WO | 2007/007608 | 1/2007 |

OTHER PUBLICATIONS

H. Pagnia et al., "Bistable Switching in Electroformed Metal-Insulator-Metal Devices", Phys. Stat.sol. (a) 108, 11 (1988), pp. 1-65.

G. Baek et al., "Highly Scalable Non-Volatile Resistive Memory using Simple Binary Oxide Driven by Asymmetric Unipolar Voltage Pulses", Process Development Team, Semiconductor R&D Center, Samsung Electronics Co., LTD., IEEE 2004, 4 pages.

An Chen et al., "Non-Volatile Resistive Switching for Advanced Memory Applications", Advanced Memory Development Group, Spansion LLC, IEEE 2005, 4 pages.

* cited by examiner

NONVOLATILE SEMICONDUCTOR MEMORY DEVICE AND WRITING METHOD OF THE SAME

CROSS-REFERENCE TO RELATED APPLICATIONS

This application is a National Phase filing under 35 U.S.C. §371 of International Application No. PCT/JP20081051654 filed on Feb. 1, 2008, and which claims priority to Japanese Patent Application No. 2007-031168 filed on Feb. 9, 2007.

TECHNICAL FIELD

One or more aspects of the present invention relate to a nonvolatile semiconductor memory device and more particularly, to a nonvolatile semiconductor memory device provided with a variable resistance element having a resistance characteristic changed by voltage application. Aspect(s) of the present invention also relate to a writing method of the nonvolatile semiconductor memory device.

BACKGROUND ART

The nonvolatile semiconductor memory devices represented by a flash memory have been widely used as high-capacity and small-scale information recording media in various fields such as computers, communication systems, measuring devices, automatic control devices, and everyday device used around individuals, and there is a great demand for a more inexpensive and high-capacity nonvolatile semiconductor memory device. It is because, since a writing can be electrically performed and data is not erased even after turning off a power supply, the nonvolatile semiconductor memory device is expected to fulfill its function in memory cards and cellular phones that are easily carried and data storages and program storages for storing data in a nonvolatile manner as initial setting to run devices.

Meanwhile, in view of the recent situation that application programs and data itself tend to expand, a system is required to enable software stored in the flash memory to be written, a bug to be fixed, and a function to be upgraded, for the future. However, according to the flash memory that represents the conventional nonvolatile semiconductor memory devices, it takes very long time to write data, and it is necessary to ensure an extra storage region to buffer a file because there is a limit to data amount that can be written at one time, so that the problem is that the process procedure becomes very complicated at the time of writing.

In addition, since it is estimated that there is a limit to miniaturization of the flash memory in principle, new type nonvolatile semiconductor memory devices to replace the flash memory have been widely studied recently. Among them, research and development have been increasingly carried out regarding a resistance-change type nonvolatile semiconductor memory device using a phenomenon in which resistance is changed by applying a voltage to a metal oxide film, because this nonvolatile semiconductor memory device has the advantage over the flash memory in view of miniaturization limit and can write data at high speed.

The phenomenon itself in which the resistance is changed by applying the voltage to the metal oxide such as nickel, iron, copper, and titanium has been studied since 1960s (refer to a non-patent document 1), but it was not put to practical use in an actual device at that time. In the late 1990s, it was proposed to use the phenomenon in which by applying a voltage pulse to manganese or copper oxide having a Perovskite structure for a short time, material deterioration can be minimally-suppressed, and the resistance can be irreversibly increased or decreased, and to apply the phenomenon to the nonvolatile semiconductor memory device, and then, it has been verified that a memory cell array composed of memory unit elements (memory cells) made by combining the variable resistance element made from these metal oxides with a transistor or a diode can be formed on a semiconductor chip actually, which was reported in IEDM (International Electron Device Meeting) in 2002 (refer to a non-patent document 2), so that studies have been extensively conducted in a semiconductor industry since then. After that, it has been reported that nickel or copper oxide studied in 1960s is also combined with the transistor or the diode based on the similar idea (refer to a non-patent document 3 and a non-patent document 4).

These techniques can be regarded as the same technique basically because they all use the resistance change of the metal oxide caused by the application of the voltage pulse, and use the different resistance states as memory information of the nonvolatile semiconductor memory device (memory element therein).

The variable resistance element (resistance element made from metal oxide) whose resistance is changed by the voltage application shows various resistance characteristics and resistance change characteristics depending on used materials of metal oxide (the metal oxide whose resistance value is changed by the voltage application is referred to as the "variable resistor" hereinafter), electrode materials, and shapes, sizes, and action conditions of the element. However, the factor of the diversity of the characteristics is not clear. That is, the researcher regards an action condition showing the best characteristic as the memory element composing the nonvolatile semiconductor memory device (referred to as the "nonvolatile semiconductor memory device element" hereinafter) made by chance, as the action condition of the element, and the entire picture of these characteristics are not sufficiently understood, and the situation in which there is no unified design guide has been continued up to the present.

The situation in which there is no unified design guide means that the variable resistance element does not reach the true meaning of industrially available technique. In other words, although the variable resistance element provided based on the above empirically optimized technique can be used as a single nonvolatile semiconductor memory device or as a component made by integrating the memory elements on a small scale, it cannot be applied to the present semiconductor memory device requiring the quality assurance of large scale and high integration of one million to one hundred million or more like the flash memory.

One specific example of the situation in which the entire picture is not grasped is the control of the element resistance of the variable resistance element. Although the switching characteristics in various element materials have been reported to the present, most of them just describe the characteristic of the produced memory element. As for the control of a resistance value, there are disclosed a method of controlling a current after programming by comparing a current value flowing at the time of programming with a reference current value and cutting voltage application when the current value exceeds the reference current value (refer to a patent document 1, for example), and a method of controlling the a current amount flowing in a variable resistance element by changing a voltage applied to a gate electrode of a selection transistor at the time of programming or erasing, in a nonvolatile semiconductor memory device having a memory cell composed of the selection transistor and the variable resistance element (refer to a patent document 2, for example).

Patent document 1: Japanese Unexamined Patent Publication No. 2006-135335

Patent document 2: Japanese Unexamined Patent Publication No. 2005-25914

Non-patent document 1: H. Pagnia et al., "Bistable Switching in Electroformed Metal-Insulator-Metal Devices", Physica Status Solidi (a), 108, pp. 11-65, 1988

Non-patent document 2: W. W. Zhuang et al., "Novell Colossal Magnetoresistive Thin Film Nonvolatile Resistance Random Access Memory (RRAM)", IEDM Technical Digest, pp. 193-196, 2002. 12

Non-patent document 3: I. G. Beak et al., "Highly Scalable Non-Volatile Resistive Memory Using Simple Binary Oxide Driven By Asymmetricunipolar Voltage Pulses", IEDM, 2004

Non-patent document 4: A. Chen et al, "Non-Volatile Resistive Switching For Advanced Memory Applications", IEDM, 2005

DISCLOSURE OF THE INVENTION

Problems to be Solved by the Invention

Before description is made of the problem to be solved by one or more aspects of the present invention and their solving means, a description is first made of the resistance change phenomenon of the variable resistance element, as a concept of the technique that is the basis of the aspect(s) of the present invention.

FIG. 17 shows a current and voltage characteristic showing a basic resistance change characteristic by voltage application to both electrodes of a variable resistance element having a structure in which a variable resistor is sandwiched between an upper electrode and a lower electrode. The measurement of the current and voltage characteristic shown in FIG. 17 was made with a commercially-available measuring equipment capable of setting an upper limit value (compliance) of a current (for example, parameter analyzer produced by Agilent Technologies, Inc., Model No. 4156B), and when the voltage value plotted on the horizontal axis is applied to both ends of the variable resistance element, the current value flowing in the variable resistance element is plotted on the vertical axis, and the resistance change characteristic is represented by this current and voltage characteristic. Although the specific voltage value and the current value vary depending on the material, element structure, production step, and element size of the sample to be measured, the qualitative characteristic shows the characteristic shown in FIG. 17 when the variable resistor is made of an oxide film containing iron, nickel, copper, titanium and the like regardless of the kind of the variable resistor.

More specifically, when the voltage not lower than a threshold voltage Va ($Va^+$ or $Va^-$) is applied to the variable resistance element showing the resistance characteristic in a high resistance state (current and voltage characteristic curve Sa in the drawing), the variable resistance element makes the transition to the resistance characteristic in a low resistance state (current and voltage characteristic curve Sb in the drawing). The current flowing in the variable resistance element increases to a current compliance value Ic1 by the applied voltage not lower than Va. At this time, the current not smaller than the compliance value Ic1 does not flow by setting the compliance value Ic1 to a value that does not exceed a current value at a transition point Tb from the low resistance state (characteristic Sb) to the high resistance state (characteristic Sa), and when the applied voltage is lowered while keeping the current value Ic1, the transition is made from the high resistance state (characteristic Sa) to the low resistance state (characteristic Sb). At this time, since the applied voltage after the transition to the low resistance state is lower than a threshold voltage Vb ($Vb^+$ or $Vb^-$) at the transition point Tb, the resistance characteristic does not go back to the high resistance state (characteristic Sa) and stably makes the transition to the low resistance state (characteristic Sb). Then, when the current compliance value is set to be not smaller than the current value at the transition point Tb, or when original setting is canceled and the voltage not lower than the threshold voltage Vb is applied to the variable resistance element showing the resistance characteristic Sb in the low resistance state, the current flowing in the variable resistance element decreases and the resistance characteristic makes the transition to the resistance characteristic Sa in the high resistance state.

When the voltage not lower than a threshold voltage Va is kept applied without setting the current compliance value while the resistance characteristic is in the high resistance state (characteristic Sa), the transition is made from the low resistance state (characteristic Sb) to the high resistance state (characteristic Sa) immediately after the transition from the high resistance state (characteristic Sa) to the low resistance state (characteristic Sb) because the applied voltage is higher than the threshold voltage Vb. As a result, an unstable oscillation phenomenon occurs in which the resistance characteristic of the variable resistance element continuously alternates between the high resistance state (characteristic Sa) and the low resistance state (characteristic Sb). When the applied voltage is lowered from such oscillation state, the oscillation stops at the voltage lower than the higher threshold voltage Va. At this point, since the applied voltage is not lower than the threshold voltage Vb, the resistance characteristic of the variable resistance element becomes the low resistance state (characteristic Sb), and the transition to the high resistance state (characteristic Sa) does not occur even if the voltage not lower than the threshold voltage Va is applied. That is, when the voltage is applied without setting the current compliance value to the single variable resistance element, the desired switching operation cannot be implemented.

Although the threshold voltage Vb to make the transition from the low resistance state to the high resistance state is lower than the threshold voltage Va to make the transition from the high resistance state to the low resistance state in the resistance characteristic shown in FIG. 17, the relation between the threshold voltages Va and Vb could be reversed. In this case, although the transition stably occurs from the high resistance state to the low resistance state at the threshold voltage Va, the oscillation occurs at the voltage not lower than the threshold voltage Vb and the transition to the low resistance state is not made even if the voltage pulse not lower than the threshold voltage Vb is applied.

The resistance value control method disclosed in the patent document 1 uses the above-described characteristic of the variable resistance element to control the current after programming by comparing the current value flowing at the time of programming with the reference current value (compliance value Ic1 shown in FIG. 17) and cutting the voltage application when the current value exceeds the reference current value. That is, according to the method disclosed in the patent document 1, the current value flowing in the variable resistance element at the time of programming is compared with the reference current and the programming is stopped when the current exceeds the reference current. More specifically, the method controls the variable element resistance by measuring the current flowing in the variable resistance element and changing the applying time of the voltage based on the measured result. Therefore, this method needs a time-consuming step in which after comparing the current value flowing in the variable resistance element with the reference current, the voltage application is cut.

However, in the case where the resistance of the variable resistance element is changed at high speed, it is difficult to precisely control the resistance value of the variable resistance element by adjusting the applying time of the voltage. In other words, the method only can be applied to the variable resistance element whose resistance is changed at relatively low speed. Furthermore, the voltage application is cut while the resistance value is changed in this method, which means that the resistance change is stopped in an unstable state before the completion of the transition phenomenon of the resistance state in which the resistance value is stable, and the resistance value is difficult to be controlled stably.

Therefore, a method of controlling the resistance value is required to allow the resistance value to be controlled by only applying the voltage under a certain condition to change the resistance value, depending on the voltage application condition without intentionally cutting the voltage application from the outside while the resistance value is changed.

Here, it can be said from the graph shown in FIG. 17 that the two following conditions need to be satisfied in order to perform the stable switching operation in the variable resistance element. That is, (1) when the resistance characteristic of the variable resistance element is changed from the high resistance state Sa to the low resistance state Sb, it is necessary to apply the voltage higher than the threshold voltage Va but lower than the threshold voltage Vb, to the variable resistance element in which the threshold voltage Va is lower than the threshold voltage Vb. Meanwhile, (2) when the resistance characteristic of the variable resistance element is changed from the high resistance state Sa to the low resistance state Sb, it is necessary to apply the voltage higher than the threshold voltage Vb but lower than the threshold voltage Va, to the variable resistance element in which the threshold voltage Vb is lower than the threshold voltage Va.

However, in the case where the switching operation is performed in the single variable resistance element having the symmetric structure reported conventionally, that is, in the case where the voltage application to the variable resistance element is turned on/off under a condition in which the load resistance is fixed to zero or a certain load resistance characteristic, the two conditions cannot be satisfied at the same time when the applied voltages to make the transition between the two resistance states have the same polarity. Therefore, in order to satisfy the two conditions, it is necessary to use asymmetry of the bipolar switching characteristic in the variable resistance element having an asymmetric structure as described below, or the monopolar switching operation using the change of the resistance characteristic due to temperature rise.

FIG. 18 shows a resistance characteristic (current and voltage characteristic) of a variable resistance element satisfying the two conditions and capable of performing the bipolar switching operation. In FIG. 18, two resistance characteristics Sa and Sb of the variable resistance element and a load resistance characteristic Sc of a load circuit are shown together. The load circuit is connected electrically to the variable resistance element in series to form a series circuit, and when a voltage is applied to both ends of the series circuit, a voltage determined by the resistance voltage division of the variable resistance element and the load circuit is applied to the variable resistance element. In FIG. 18, the voltages at cross points between the load resistance characteristic Sc, and the resistance characteristics Sa (high resistance state) and Sb (low resistance state) are actually applied to the variable resistance element, and the voltage at the cross point between the load resistance characteristic Sc and the voltage axis shows the voltage applied to both ends of the series circuit. The load resistance characteristic Sc moves in parallel in a lateral direction (voltage axis direction) by increasing and decreasing the voltage applied to both ends of the series circuit. The following description is made assuming that the load resistance shows the linear (rectilinear) load resistance characteristic as the load circuit in the example shown in FIG. 18.

According to the current and voltage characteristic shown in FIG. 18, a threshold voltage $VA^+$ to make the transition from the high resistance state (characteristic Sa) to the low resistance state (characteristic Sb) by applying the voltage to the series circuit on one polarity (positive polarity) side is lower than a threshold voltage $VB^+$ to make the transition from the low resistance state Sb to the high resistance state Sa on the same polarity (positive polarity) side in absolute value, and when the voltage not lower than the threshold voltage $VA^+$ is applied to both ends of the series circuit, the voltage not lower than the threshold voltage $Va^+$ is applied to both ends of the variable resistance element, and the transition from the high resistance state to the low resistance state occurs. In other words, in the example shown in FIG. 18, the load circuit serves a similar function as that provided by setting the current compliance described with reference to FIG. 17. Namely, by the presence of the load circuit, the voltage drops through the load circuit because of the increase of the current flowing in the variable resistance element due to the transition from the high resistance state Sa to the low resistance state Sb, and the applied voltage to the variable resistance element is automatically lowered. By setting the load resistance characteristic of the load circuit properly, the absolute value of the applied voltage to the variable resistance element after the transition to the low resistance state is lower than a threshold voltage $Vb^+$ to change the resistance characteristic from the low resistance state to the high resistance state, so that the transition can be stably implemented from the high resistance state to the low resistance state. Meanwhile, even if the voltage not lower than the threshold voltage $VB^+$ having the same polarity (positive polarity) is applied to the series circuit after the transition to the low resistance state, the transition from the low resistance state to the high resistance state does not occur because the voltage not lower than the threshold voltage $Vb^+$ that is higher than the threshold voltage $Va^+$ is applied to both ends of the variable resistance element.

In addition, according to this method, unlike the method disclosed in the patent document 1 in which the voltage application is stopped when the current amount of the current flowing in the variable resistance element exceeds the reference value (when the resistance characteristic makes the transition from the high resistance state to the low resistance state), a resistance ratio between the resistance value of the variable resistance element and the load circuit as the resistance value of the variable resistance element changes, and the voltage applied to both ends of the variable resistance element determined by division of the applied voltage according to the resistance ratio is sequentially changed, so that only by previously setting the load resistance value and the applied voltage to a certain condition, the transition of the resistance state is automatically stopped after the automatic transition to a state (stable state) in which the resistance state of the variable resistance element cannot be changed any more, based on the change of the resistance value of the variable resistance element and the corresponding change of the applied voltage.

As a result, the resistance value can be easily and strictly controlled as compared with the method in the patent document 1.

Similarly, a threshold voltage $VB^-$ to make the transition from the low resistance state (characteristic Sb) to the high resistance state (characteristic Sa) by applying the voltage to the series circuit on the other polarity (negative polarity) side is lower than a threshold voltage $VA^-$ to make the transition from the high resistance state to the low resistance state on the same polarity (negative polarity) side in absolute value, and when the voltage not lower than the threshold voltage $VB^-$ is applied to both ends of the series circuit, the voltage not lower than the threshold voltage $Vb^-$ in absolute value is applied to both ends of the variable resistance element, and the transition from the low resistance state to the high resistance state occurs. By setting the load resistance characteristic of the load circuit on the negative polarity side in common to the positive polarity side, the absolute value of the applied voltage to the variable resistance element after the transition to the high resistance state is lower than a threshold voltage $Va^-$ to change the resistance characteristic from the high resistance state to the low resistance state, so that the transition can be stably implemented from the low resistance state to the high resistance state. However, even if the voltage not lower than the threshold voltage $VA^-$ having the same polarity (negative polarity) in absolute value is applied to the series circuit after the transition to the high resistance state, the transition from the high resistance state to the low resistance state does not occur because the voltage not lower than the threshold voltage $Va^-$ that is higher than the threshold voltage $Vb^-$ is applied to both ends of the variable resistance element.

Here, it is to be noted that even though the threshold voltages $Vb^+$ and $Vb^-$ to make the transition from the low resistance state to the high resistance state are lower than the threshold voltages $Va^+$ and $Va^-$ to make the transition from the high resistance state to the low resistance state, respectively regardless of the polarity of the applied voltage in the single variable resistance element, the threshold voltage $VA^+$ can be lower than the threshold voltage $VB^+$ in absolute value on the positive polarity side, and the threshold voltage $VB^-$ can be lower than the threshold voltage $VA^-$ in absolute value on the negative polarity side as the threshold voltages of the applied voltage to the series circuit, by making asymmetric a relative relation (voltage difference or voltage ratio, for example) between the threshold voltages $Va^+$ and $Vb^+$ and a relative relation between the threshold voltages $Va^-$ and voltage $Vb^-$ and setting the load resistance characteristic of the load circuit properly. As a result, the relation between the threshold voltages $VA^+$ and voltage $VB^+$ and the relation between the threshold voltages $VB^-$ and $VA^-$ can be inverted, and the stable bipolar switching operation can be performed by applying the positive and negative bipolar voltages.

Here, the asymmetry between the positive and negative polarities in the relative relation between the threshold voltages of the variable resistance element shown in FIG. 18 can be achieved by making vertically asymmetric the materials of the lower electrode and the upper electrode of the variable resistance element, the composition of the variable resistor, the element configuration or the element size. Particularly, in order to implement the stable bipolar switching, excessive asymmetry is to be achieved in some cases by using different materials for the lower electrode and the upper electrode, or forming an interface structure between the lower electrode and the variable resistor so as to be different from that between the upper electrode and the variable resistor. For example, when either the interface between the lower electrode and the variable resistor or the interface between the upper electrode and the variable resistor shows a rectifying characteristic such as schottky junction, preferable asymmetry is likely to appear.

However, in the case of using such bipolar switching characteristic, only two states of the low resistance state and the high resistance state are implemented by generating the transition phenomenon from the low resistance state to the high resistance state or its reverse transition on the positive polarity side and the negative polarity side. That is, information having only up to two values can be stored in the variable resistance element showing the bipolar switching characteristic, and information having more than three values cannot be stored. This suggests that there is a certain limit to realization of the semiconductor memory device capable of increasing the memory capacity while suppressing the increase of the occupied area.

Other than the bipolar switching characteristic, there is a case where the resistance value of the variable resistance element is controllably changed by changing a voltage applying time while the polarity of the voltage applied to the variable resistance element is remained the same, which is called a monopolar switching characteristic. In addition, the resistance value change phenomenon of the variable resistance element using the monopolar switching characteristic is referred to as the "monopolar switching operation" hereinafter.

FIGS. 19A and 19B show resistance characteristics (current and voltage characteristic) of a variable resistance element capable of implementing the monopolar switching operation satisfying the two conditions. FIG. 19A shows the resistance characteristic (current and voltage characteristic) of the variable resistance element at the time of applying a voltage pulse having a short pulse width (voltage applying time), and FIG. 19B shows the resistance characteristic (current and voltage characteristic) of the variable resistance element at the time of applying a voltage pulse having a long pulse width (voltage applying time). In FIG. 19, similar to that in FIG. 18, two resistance characteristics Sa and Sb of the variable resistance element, and a load resistance characteristic Se of a load circuit are shown together.

According to the current and voltage characteristic shown in FIG. 19A, a threshold voltage VAs to make the transition from the high resistance state Sa to the low resistance state Sb by applying the voltage pulse having the short pulse width to a series circuit is lower than a threshold voltage VBs to make the transition from the low resistance state to the high resistance state in absolute value with the same pulse width, and when the voltage pulse not lower than the threshold voltage VAs in absolute value is applied to both ends of the series circuit, a voltage not lower than a threshold voltage Vas is applied to both ends of the variable resistance element and the transition from the high resistance state to the low resistance state occurs. Here, in this example shown in FIG. 19, similar to that shown in FIG. 18, the same effect as described with reference to FIG. 17 is achieved by using a load circuit instead of setting the current compliance as shown in FIG. 17. Namely, by the presence of the load circuit, the voltage drops through the load circuit because of the increase of the current flowing in the variable resistance element due to the transition from the high resistance state to the low resistance state, and the applied voltage to the variable resistance element is automatically lowered. By setting the load resistance characteristic of the load circuit properly, the absolute value of the applied voltage to the variable resistance element after the transition to the low resistance state is lower than a threshold voltage Vbs to change the resistance characteristic from the low resistance state to the high resistance state, so that the transition can be stably implemented from the high resistance state to the low resistance state. Meanwhile, even if the voltage not lower than the threshold voltage VBs is applied to the series circuit by applying the voltage pulse having the same pulse width after the transition to the low resistance state, the transition from the low resistance state to the high resistance state does not occur because the voltage not lower than the threshold voltage Vbs that is higher than the threshold voltage Vas is applied to both ends of the variable resistance element.

On the contrary, according to the current and voltage characteristic shown in FIG. 19B, a threshold voltage VB1 to make the transition from the low resistance state Sb to the high resistance state Sa by applying the voltage pulse having the long pulse width to the series circuit is lower than a threshold voltage VA1 to make the transition from the high resistance state to the low resistance state in absolute value with the same long pulse width, and when the voltage pulse not lower than the threshold voltage VB1 in absolute value is applied to both ends of the series circuit, a voltage not lower than a threshold voltage Vb1 in absolute value is applied to both ends of the variable resistance element and the transition from the low resistance state to the high resistance state occurs. By setting the load resistance characteristic of the load circuit in the case of the long pulse width in common to the short pulse width, the absolute value of the applied voltage to the variable resistance element after the transition to the high resistance state is lower than a threshold voltage Va1 to change the resistance characteristic from the high resistance state to the low resistance state, so that the transition can be stably implemented from the low resistance state to the high resistance state. Meanwhile, even if the voltage not lower than the threshold voltage VA1 is applied to the series circuit by applying the voltage pulse having the same long pulse width after the transition to the high resistance state, the transition from the high resistance state to the low resistance state does not occur because the voltage not lower than the threshold voltage Va1 that is higher than the threshold voltage Vb1 is applied to both ends of the variable resistance element.

Therefore, although the resistance characteristic of the variable resistance element can be changed only one to the other between the high resistance state Sa and the low resistance state Sb, it cannot be changed conversely with the same pulse width, so that the stable switching operation cannot be performed. Meanwhile, in the monopolar switching operation, by using the voltage pulses having two kinds of long and short pulse widths and the same polarity, the transition from the high resistance state to the low resistance state can be stably implemented by applying the voltage pulse having one of the two different pulse widths, and the transition from the low resistance state to the high resistance state can be stably implemented with the other thereof.

Here, it is to be noted that even though the threshold voltages Vbs and Vb1 to make the transition from the low resistance state to the high resistance state are lower than the threshold voltages Vas and Va1 to make the transition from the high resistance state to the low resistance state, respectively, regardless of the long and short pulse widths in the single variable resistance element, the threshold voltage VAs can be lower than the threshold voltage VBs in absolute value in the case of short pulse width, and the threshold voltage VB1 can be lower than the threshold voltage VA1 in absolute value in the case of long pulse width as the threshold voltages of the applied voltages to the series circuit, by differentiating a relative relation (voltage difference or voltage ratio, for example) between the threshold voltages Vas and Vbs and a relative relation between the threshold voltages Va1 and voltage Vb1 due to the long and short pulse widths and setting the load resistance characteristic of the load circuit properly. As a result, the relation between the threshold voltages VAs and VBs and the relation between the threshold voltages VB1 and VA1 can be inverted, and the stable monopolar switching operation can be performed by applying the voltage pulses having the different pulse widths.

Here, it is considered that the difference in the relative relation between the threshold voltages Va1 and Vb1 of the variable resistance element shown in FIG. 19 due to the long and short pulse widths is generated because the resistance value of the variable resistance element or the resistance component of its vicinity is changed by Joule heat generated in the variable resistance element when the voltage pulse having the long pulse width is applied, and then the resistance characteristics of the high resistance state Sa and the low resistance state Sb of the variable resistance element are changed. Particularly, in the case where the voltage magnitude of the voltage pulse applied to the series circuit is fixed, a considerable large amount of the Joule heat is generated when the voltage pulse having the long pulse width is applied to the variable resistance element in the low resistance state Sb, and it is considered that a conspicuous resistance characteristic change appears in the low resistance state Sb due to the difference in pulse width. That is, as can be seen by comparison between FIGS. 19A and 19B, due to the affect of the Joule heat, the resistance characteristic in the low resistance state Sb is more lowered in the case where the voltage pulse having the long pulse width is applied (the current and voltage characteristic has a sharp inclination), and the threshold voltage VB1 is lower than the threshold voltage VBs in the case where the voltage pulse is short.

With the monopolar switching operation, the information having at least two values can be stored by the application of the voltage having the same polarity. Therefore, it is considered that multilevel information can be stored in one memory cell by combining this monopolar switching characteristic with the bipolar switching characteristic.

However, when the monopolar switching operation is used, a time required for the voltage application is increased because it is necessary to use the voltage pulses having the two kinds of long and short pulse widths, as compared with the case of the bipolar switching operation that can control the resistance value at least without depending on the pulse width of the applied voltage. This means that a time required for writing the information is increased. In view of the fact that the size (capacity) of the various kinds of information handled by demanders goes on increasing nowadays, the increase in time required for writing in one memory cell leads the increase in time required for a user to read or program desired information, and the user has to wait for some time until the completion of the reading or programming process, which could cause the user carrying out the operation to feel stress.

By the way, the patent document 2 discloses the method of implementing the stable switching operation by controlling the current amount flowing in the variable resistance element by changing the voltage applied to the gate electrode of the selection transistor at the time of programming or erasing, in the nonvolatile semiconductor memory device in which the memory cell is composed by combining the selection transistor and the variable resistance element. However, the patent document 2 conceives only the memory cell for storing the two values and its purpose is to stably execute the programming and erasing in the memory cell, so that the memory cell that can store three or more values is not described at all. Consequently, the patent document 2 is different from the present invention in purpose.

The present invention has been made at least in part in view of the above problems in the conventional resistance control in the nonvolatile semiconductor memory device including the variable resistance element having the resistance characteristic that is changed by voltage application, and an object is to provide a highly reliable and large-capacity nonvolatile semiconductor memory device capable of controlling resistance stably with high accuracy and having a structure designed based on unified understanding of a resistance change phenomenon.

Means for Solving the Problem

The present invention to achieve the object is characterized as a first characteristic in that an object of a nonvolatile semiconductor memory device comprises a memory cell array composed of a plurality of memory cells each including a variable resistance element having a two-terminal structure in which a resistance characteristic defined by a current and voltage characteristic at both ends is changed by applying a voltage satisfying a predetermined condition to the both ends, and information related to the resistance characteristic can be stored; a load circuit connected to one terminal of the variable resistance element in series; and a voltage generation circuit for applying a voltage to both ends of a series circuit of the variable resistance element and the load circuit, wherein the load circuit is configured to controllably change a load resistance characteristic defined by a current and voltage characteristic, the voltage generation circuit is configured to controllably change a voltage generation condition of a voltage generated from the voltage generation circuit, the variable resistance element is configured so that the resistance characteristic transits to one resistance characteristic determined based on the load resistance characteristic of the load circuit and the voltage generation condition from the voltage generation circuit in response to application of the voltage generated from the voltage generation circuit to the series circuit, and information having at least three values can be stored by setting one transition condition provided by changing one or both of the load resistance characteristic of the load circuit and the voltage generation condition from the voltage generation circuit, applying the voltage generated from the voltage generation circuit to the series circuit of a target memory cell to be written under the transition condition, and selectively changing the resistance characteristic of the variable resistance element of the target memory cell to one resistance characteristic selected from at least three different resistance characteristics including a resistance characteristic shown before the voltage is applied.

According to an aspect of the present invention, on the basis of a new knowledge that the resistance characteristic of the variable resistance element after the voltage application is determined by a cross point between a low resistance final curve or a high resistance final curve (referred to as the "final curve" collectively hereinafter) determined as property values of the variable resistance element and the load resistance characteristic, the nonvolatile semiconductor memory device is based on a new idea that the resistance characteristic after the voltage application is controlled by allowing the load resistance characteristic and the final curve to be selected. That is, according to the first characteristic configuration of the nonvolatile semiconductor memory device of the present invention, the resistance characteristic of the variable resistance element after the voltage application is determined based on the transition condition set by changing one or both of the load resistance characteristic and the voltage generation condition, and can be changed to the one resistance characteristic selected from at least three different resistance characteristics by combining the load resistance characteristic and the voltage generation condition. Therefore, the information having at least three values can be stored in each memory cell by relating different memory information to the resistance characteristics of the variable resistance element provided in each memory cell, respectively. Thus, the memory capacity can be increased while preventing an occupied area of the memory cell from being increased, whereby the large-scale memory device can be provided.

Furthermore, according to this configuration, when writing is performed, the transition condition is set to the one required for the transition to the resistance characteristic previously related to the memory information after written and then the voltage is just applied to the writing target memory cell, so that a complicated process is not needed when the writing process is performed.

In addition to the first characteristic configuration, the nonvolatile semiconductor memory device according to an embodiment of the present invention is characterized as a second characteristic in that the load circuit is configured to be set at least two different load resistance characteristics, and the variable resistance element can transits to different resistance characteristics depending on which one of the two different load resistance characteristics is set to the load resistance characteristic of the load circuit when the voltage generated from the voltage generation circuit is applied to the series circuit, under the same voltage generation condition.

According to the second characteristic configuration of the nonvolatile semiconductor memory device in the present invention, the variable resistance element can transits to different resistance characteristics by changing the load resistance characteristic of the load circuit even under the same voltage generation condition. The variable resistance element can transits to the three or more different resistance characteristics by combining the control of the change of the load resistance characteristic and the control of the change of the voltage generation condition, whereby the memory cell can store multilevel information.

In addition to the first or second characteristic configuration, the nonvolatile semiconductor memory device according to an embodiment of the present invention is characterized as a third characteristic in that the variable resistance element is configured to select one resistance characteristic from at least four different resistance characteristics of a first resistance characteristic, a second resistance characteristic, a third resistance characteristic, and a fourth resistance characteristic, and the resistance characteristic of the variable resistance element connected to the series circuit transits between the first to fourth resistance characteristics mutually and selectively by setting one transition condition by changing one or both of the load resistance characteristic and the voltage generation condition, and performing a process for applying the voltage generated from the voltage generation circuit to the series circuit at one or more time under the transition condition.

According to the third characteristic configuration of the nonvolatile semiconductor memory device in the present invention, information having different four values can be stored in one memory cell by relating different memory information to the first to fourth resistance characteristics, respectively. Thus, the memory capacity can be increased while preventing the occupied area of the memory cell from being increased, whereby the large-scale memory device can be provided.

In addition to the third characteristic configuration, the nonvolatile semiconductor memory device according to an embodiment of the present invention is characterized as a fourth characteristic in that when the voltage generated from the voltage generation circuit is applied to the series circuit of the variable resistance element and the load circuit, the variable resistance element showing the second resistance characteristic or the fourth resistance characteristic, with the load resistance characteristic and the voltage generation condition set to a predetermined first transition condition, the variable resistance element transits to the first resistance characteristic; when the voltage generated from the voltage generation circuit is applied to the series circuit of the variable resistance element and the load circuit, the variable resistance element showing the first resistance characteristic or the third resistance characteristic, with the load resistance characteristic and the voltage generation condition set to a predetermined second transition condition, the variable resistance element transits to the second resistance characteristic; when the voltage generated from the voltage generation circuit is applied to the series circuit of the variable resistance element and the load circuit, the variable resistance element showing the second resistance characteristic or the fourth resistance characteristic, with the load resistance characteristic and the voltage generation condition set to a predetermined third transition condition, the variable resistance element transits to the third resistance characteristic; and when the voltage generated from the voltage generation circuit is applied to the series circuit of the variable resistance element and the load circuit, the variable resistance element showing the first resistance characteristic or the third resistance characteristic, with the load resistance characteristic and the voltage generation condition set to a predetermined fourth transition condition, the variable resistance element transits to the fourth resistance characteristic.

According to the fourth characteristic configuration of the nonvolatile semiconductor memory device in the present invention, when the load resistance characteristic and the voltage generation condition corresponding to each of the first to fourth transition conditions can be properly switched based on designated writing process contents, the target memory cell can transit to each resistance characteristic of the first to fourth resistance characteristics. More specifically, by previously setting the load resistance characteristics and the voltage generation conditions corresponding to the transition conditions, and allowing to select one process from those based on the writing process, the nonvolatile semiconductor memory device capable of storing multilevel information without needing a complicated control at the time of the writing process can be provided.

In addition to the fourth characteristic configuration, the nonvolatile semiconductor memory device according to an embodiment of the present invention is characterized as a fifth characteristic in that the load resistance characteristic is in common and only the voltage generation conditions are different between the first and second transition conditions, and the voltage generation condition is in common and only the load resistance characteristics are different between the first and third transition conditions and between the second and fourth transition conditions.

According to the fifth characteristic configuration of the nonvolatile semiconductor memory device in the present invention, since the number of the load resistance characteristics and the voltage generation conditions to be set based on the transition conditions can be small, the control contents can be further simplified.

In addition to the fourth or fifth characteristic configuration, the nonvolatile semiconductor memory device according to an embodiment of the present invention is characterized as a sixth characteristic in that the first and third resistance characteristics show lower resistance state than the second and fourth resistance characteristics.

In addition to any one of the first to sixth characteristic configurations, the nonvolatile semiconductor memory device according to an embodiment of the present invention is characterized as a seventh characteristic in that the memory cell array comprises the memory cells arranged in a row direction and a column direction, respectively, a plurality of word lines extending in the row direction, and a plurality of bit lines extending in the column direction, in which one ends of the memory cells in the same row are connected to a common word line, and the other ends of the memory cells in the same column are connected to a common bit line, and the load circuit is formed outside the memory cell array, and electrically connected to at least one of a selected word line selected from the plurality of word lines and a selected bit line selected from the plurality of bit lines.

According to the seventh characteristic configuration of the nonvolatile semiconductor memory device in the present invention, since the load circuit forming the series circuit with the variable resistance element can be formed outside the memory cell array, the occupied area of the memory cell array can be reduced as compared with a case where the load circuit is formed in the memory cell array.

In addition to any one of the first to seventh characteristic configurations, the nonvolatile semiconductor memory device according to an embodiment of the present invention is characterized as an eighth characteristic in that the load circuit has a plurality of polycrystalline silicon bodies showing ohmic characteristics having different resistance values, and the load resistance characteristic is controllably changed by selecting one from the polycrystalline silicon bodies and connecting the selected polycrystalline silicon body to the one end of the variable resistance element to form the series circuit.

In addition to any one of the first to seventh characteristic configurations, the nonvolatile semiconductor memory device according to an embodiment of the present invention is characterized as a ninth characteristic in that the load circuit has an MOS transistor, and the load resistance characteristic is controllably changed by controlling a voltage applied to a gate electrode of the MOS transistor.

In addition to any one of the first to ninth characteristic configurations, the nonvolatile semiconductor memory device according to an embodiment of the present invention is characterized as a tenth characteristic in that the variable resistance element is made from titanium oxynitride, nickel oxide, or copper oxide.

An example writing method of a nonvolatile semiconductor memory device according to the present invention is a writing method of the nonvolatile semiconductor memory device according to any one of the first to tenth characteristic configurations, and characterized as a first characteristic by comprising: setting one transition condition selected from at least three kinds of transition conditions by changing one or both of the load resistance characteristic and the voltage generation condition; applying the voltage generated from the voltage generation circuit to both ends of the series circuit composed of the variable resistance element and the load circuit in the memory cell to be written under the set transition condition; and changing the resistance characteristic of the variable resistance element to one resistance characteristic related to a storage state after writing, so that one information state among information having at least three values is written.

According to the first characteristic of the example writing method of the nonvolatile semiconductor memory device in the present invention, the writing process can be performed in the memory cell capable of storing three or more values, by controlling a change in one or both of the previously set load resistance characteristic and voltage generation condition.

Effect of the Invention

According to an example configuration of the present invention, a nonvolatile semiconductor memory device capable of storing multiple values with a simple control can be provided. Thus, a large-capacity memory device can be implemented while preventing a device scale from being increased.

BEST MODE FOR CARRYING OUT THE INVENTION

First Embodiment

Hereinafter, described is a first embodiment (hereinafter occasionally referred to as "this embodiment") of a nonvolatile semiconductor memory device according to the present invention (hereinafter occasionally referred to as "the present inventive device") and a writing method of the same (hereinafter occasionally referred to as "the present inventive method") with reference to FIGS. 1 to 8.

Description of Structure of the Present Inventive Device

Figure 1:
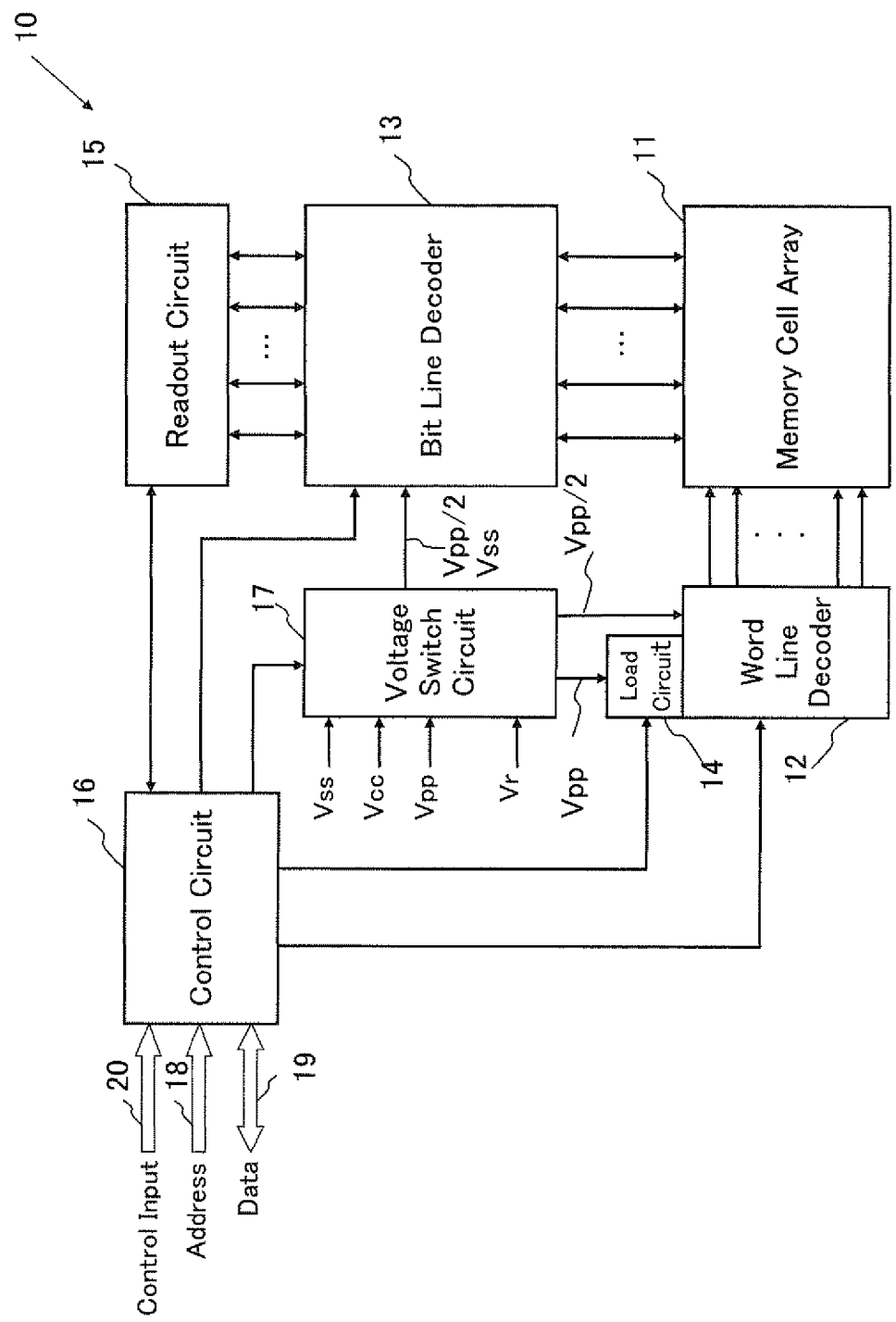
FIG. 1 is a block diagram showing a schematic configuration of a nonvolatile semiconductor memory device according to an embodiment of the present invention.

FIG. 1 is a block diagram showing a schematic configuration of the present inventive device as one example. As shown in FIG. 1, present inventive device 10 includes a memory cell array 11, a word line decoder (corresponding to a word line selection circuit) 12, a bit line decoder (corresponding to a bit line selection circuit) 13, a load circuit 14, a readout circuit 15, a control circuit 16, and a voltage switch circuit (voltage generation circuit) 17.

The memory cell array 11 has a configuration in which a plurality of nonvolatile memory cells are arranged in each row direction and column direction, and information can be electrically programmed in a memory cell designated by an address input from the outside, and the information stored in the memory cell designated by the address input can be read. More specifically, information is stored in the specific memory cell in the memory cell array 11 based on an address signal inputted from an address line 18, and the information is outputted to an external device through a data line 19. Here, each memory cell includes a variable resistance element having a three-layer structure body composed of an upper electrode, a lower electrode, and a variable resistor sandwiched between them. This embodiment uses the variable resistance element having bipolar switching characteristic described above.

The word line decoder 12 is connected to each word line of the memory cell array 11, selects the word line of the memory cell array 11 as a selected word line based on a row selecting address signal inputted to the address line 18, and applies a selected word line voltage and an unselected word line voltage corresponding to each memory action of programming, erasing, and reading, to the selected word line and the unselected word line, respectively.

The bit line decoder 13 is connected to each bit line of the memory cell array 11, selects the bit line of the memory cell array 11 as a selected bit line based on a column selecting address signal inputted to the address line 18, and applies a selected bit line voltage and an unselected bit line voltage corresponding to each memory action of programming, erasing, and reading, to the selected bit line and the unselected bit line, respectively.

The load circuit 14 is configured to be electrically connected in series with the selected memory cell selected from the memory cell array 11 by the word line decoder 12 and the bit line decoder 13 as a writing target at the time of the programming or erasing action. The load resistance characteristic defined by a current and voltage characteristic can be changed by the control from the control circuit 16. According to this embodiment, it is assumed that the load circuit 14 is made from polycrystalline silicon, and its load resistance characteristic is ohmic characteristic and set to 10Ω, 200Ω, and 400Ω, respectively, for example that can be switched among them. The load circuit 14 is arranged between the word line decoder 12 and the voltage switch circuit 17, and the one load circuit 14 is provided for the memory cell array 11 and arranged outside the memory cells.

The control circuit 16 controls the memory actions of programming, erasing, and reading in the memory cell array 11. The control circuit 16 controls the word line decoder 12 and the bit line decoder 13 to control the reading, programming, and erasing actions in the memory cell array 11 based on the address signal inputted from the address line 18, a data input inputted from the data line 19 (at the time of programming action), and a control input signal inputted from a control signal line 20. Specifically, in each memory action, the voltage switch circuit 17, the word line decoder 12, and the bit line decoder 13 are controlled to apply a predetermined voltage according to each memory action to each of the selected word line, unselected word line, the selected bit line, and the unselected bit line. Particularly, at the time of programming and erasing actions, a voltage magnitude and a pulse width of each voltage pulse applied to the programming target memory cell through the load circuit are controlled. In addition, at the time of writing action, the load resistance characteristic of the load circuit 14 is controlled and switched. In the example shown in FIG. 1, the control circuit 16 is provided with functions as an address buffer circuit, a data input/output buffer circuit, and a control input buffer circuit that are commonly used although they are not shown.

The programming and erasing mean the transition (switching) of the resistance characteristic of the variable resistance element composing the memory cell. Here, the memory cell provided in the present inventive device is configured to have three or more different resistance characteristics, and three or more values can be stored therein by relating different information to the resistance characteristics, respectively.

According to this embodiment, the load circuit 14 is arranged between the word line decoder 12 and the voltage switch circuit 17 (namely outside the memory cell array 11), and the one load circuit is provided for the memory cell array 11 composed of the many memory cells. Thus, as described above, the load circuit 14 is configured to have three different load resistance characteristics that can be switched to each other.

The voltage switch circuit (voltage generation circuit) 17 applies a selected word line voltage, an unselected word line voltage, a selected bit line voltage, and an unselected bit line voltage required for the reading, programming, and erasing actions in the memory cell array 11, to the word line decoder 12 and the bit line decoder 13. Reference Vcc represents a supply voltage (power supply voltage) of the present inventive device 10, reference Vss represents a ground voltage, reference Vpp represents a programming or erasing voltage (the voltage corresponds to the process), and reference Vr represents a reading voltage. In the configuration shown in FIG. 1, the selected word line voltage during the programming and erasing actions is supplied to the word line decoder 12 through the load circuit 14.

The data is read from the memory cell array 11 through the bit line decoder 13 and the readout circuit 15. The readout circuit 15 determines the state of data and transmits its result to the control circuit 16 so that it is outputted to the data line 19.

Figure 2:
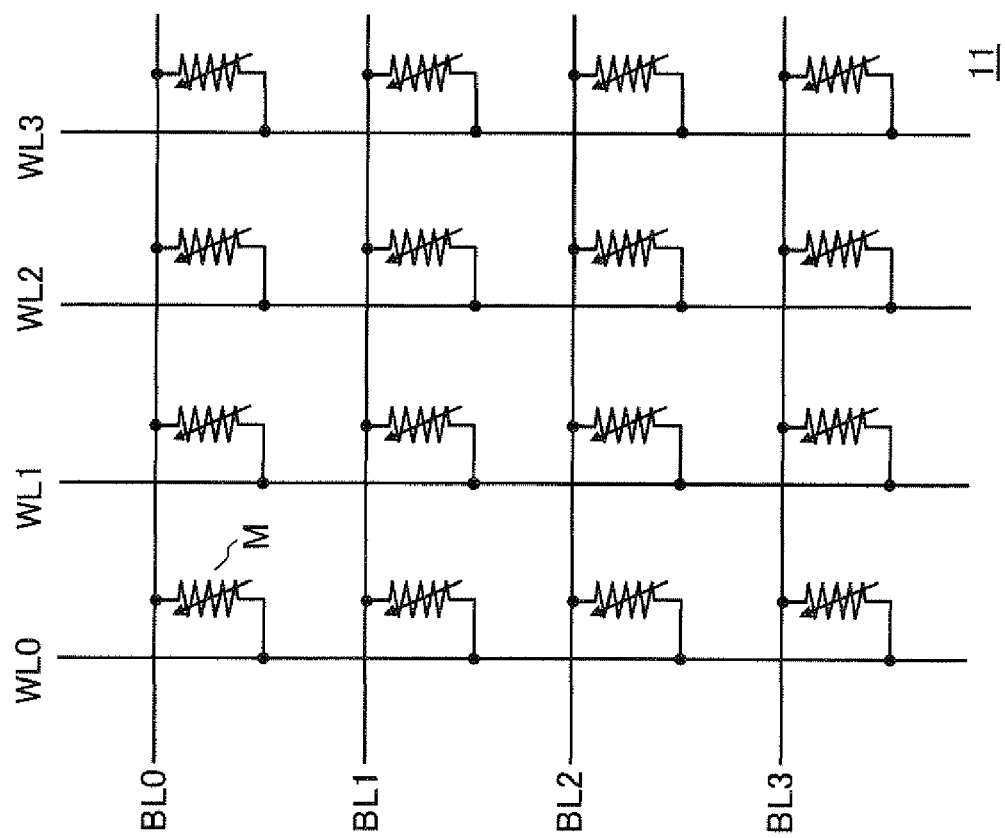
FIG. 2 is a view showing a partial configuration of a memory cell array provided in the nonvolatile semiconductor memory device according to the present invention.

FIG. 2 shows schematically a partial configuration of the memory cell array 11 of the present inventive device 10. In FIG. 2, memory cells M are arranged between the cross points of four bit lines BL0 to BL3 and four word lines WL0 to WL3, respectively in the memory cell array 11. As shown in FIG. 2, the memory cell array 11 has a cross-point type memory cell array structure in which the memory cells M each having a two-terminal structure and having a variable resistance element for storing the information in response to the change of electric resistance are arranged in a row direction and a column direction, respectively, the plurality of word lines extend in the row direction, the plurality of bit lines extend in the column direction, one ends of the memory cells in the same row are connected to the common word line, and the other ends of the memory cells in the same column are connected to the common bit line.

Each memory cell in the memory cell array 11 provided in the present inventive device 10 assumes that when the writing (programming or erasing) voltage pulse is applied between the two terminals of the variable resistance element having the two-terminal structure, the resistance characteristic defined by the current and voltage characteristic of the variable resistance element are changed, that is, the electric resistance under a certain bias condition is changed, whereby information can be programmed.

Figure 3:
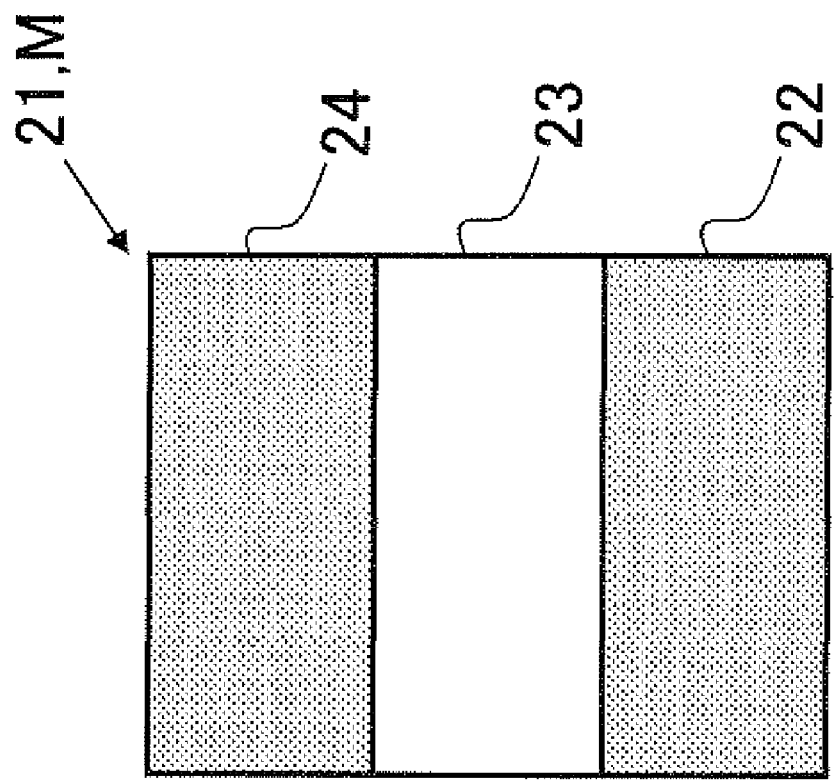
FIG. 3 is a schematic cross-sectional view of a variable resistance element composing a memory cell of the nonvolatile semiconductor memory device according to an embodiment of the present invention.

FIG. 3 is a schematic cross-sectional structure diagram of the variable resistance element composing each memory cell of the present inventive device 10. As shown in FIG. 3, a variable resistance element 21 composing the memory cell M has a three-layer structure body composed of a lower electrode 22, a variable resistor 23, and an upper electrode 24. Although the variable resistor 23 is sandwiched between the two electrodes of the lower electrode 22 and the upper electrode 24 vertically in FIG. 3, the sandwiching direction is not limited to the vertical direction (namely, the direction perpendicular to a substrate surface), and the variable resistor may be sandwiched between the two electrodes formed in a direction parallel to the substrate surface. In the following description, it is assumed that the variable resistance element 21 has the variable resistor 23 sandwiched between the two electrodes vertically as shown in FIG. 3.

The variable resistance element 21 composing the memory cell in this embodiment is configured to be vertically asymmetric, and the lower electrode 22 and the upper electrode 24 are made of different metal materials, or they have different electrode areas, for example. Alternatively, the vertical asymmetry may be provided by differentiating a contact state of an interface between the variable resistor 23 and the lower electrode 22 from a contact state of an interface between the variable resistor 23 and the upper electrode 24. For example, the lower electrode 22 is made from TiN, the variable resistor 23 is made from titanium oxynitride ($TiO_xN_y$) formed by oxidizing an upper surface of this TiN electrode, and the upper electrode 24 is made by depositing Pt, TiN, W, Co, Ni and the like thereon. Namely, it is assumed that each memory cell composing the memory cell array 11 in the present inventive device 10 has the vertically asymmetric variable resistance element 21, and the bipolar switching can be implemented by applying negative and positive bipolar voltages. For example, the resistance characteristic of the variable resistance element 21 can be switched between a low resistance state and a high resistance state by alternately applying a first negative writing voltage by which the upper electrode 24 shows the negative polarity based on the lower electrode 22 and a second positive writing voltage having the opposite polarity, to both ends of the variable resistance element 21 for a certain period of time.

Description of Actions of the Present Inventive Device

Next, described is a new knowledge that is fundamental to the present invention and then, described is one example of the writing action in the present inventive device.

Figure 4:
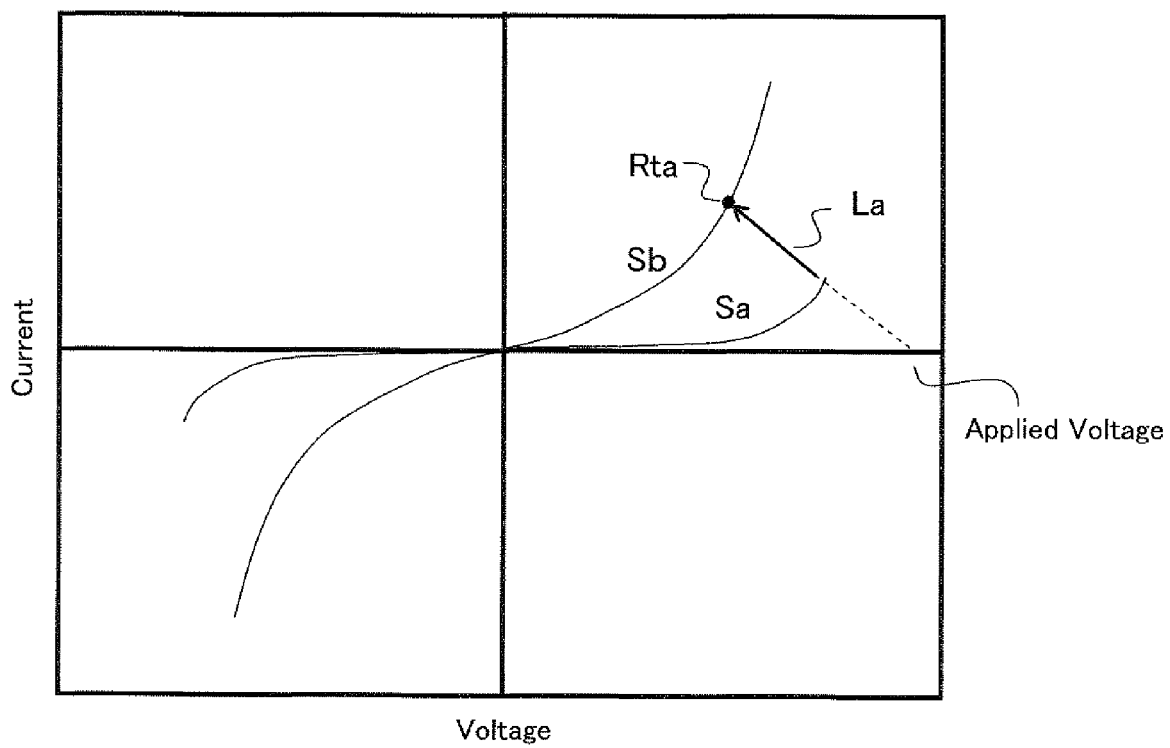
FIG. 4 is a schematic view (1) showing a resistance change characteristic of the variable resistance element.
Figure 18:
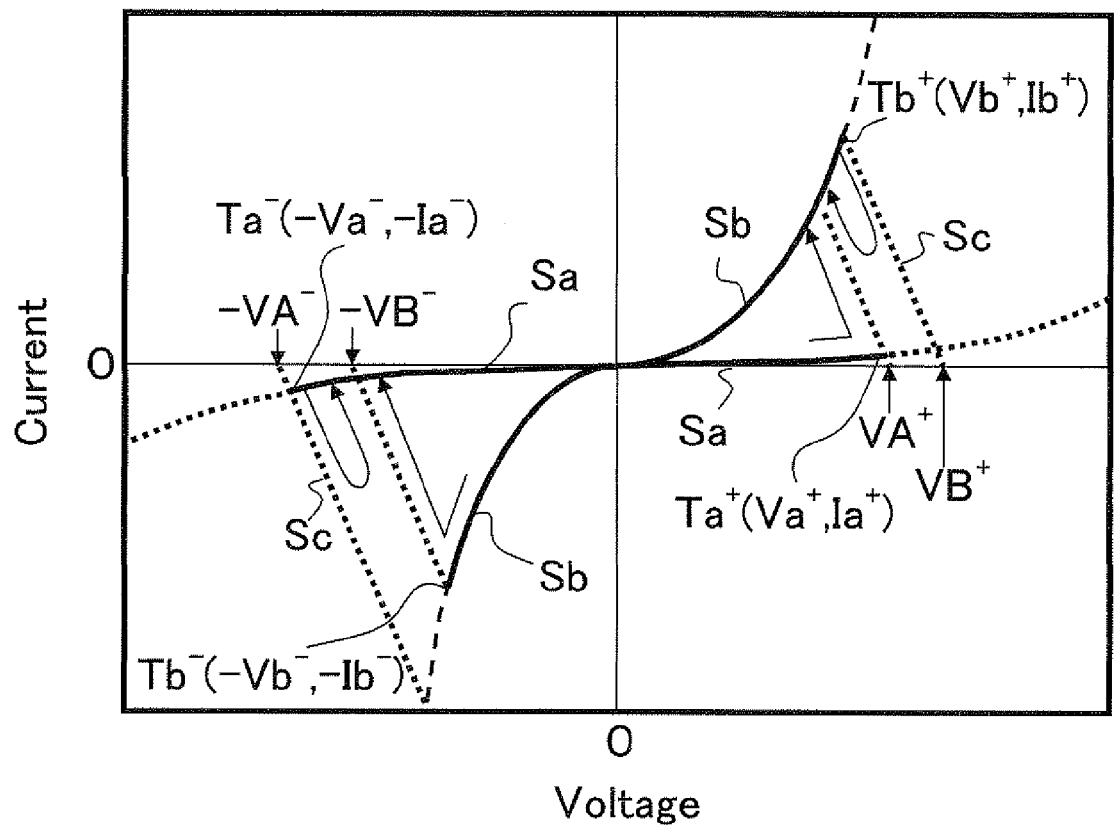
FIG. 18 is a graph showing a resistance characteristic (current and voltage characteristic) of a variable resistance element capable of implementing a bipolar switching operation.
Figure 19A:
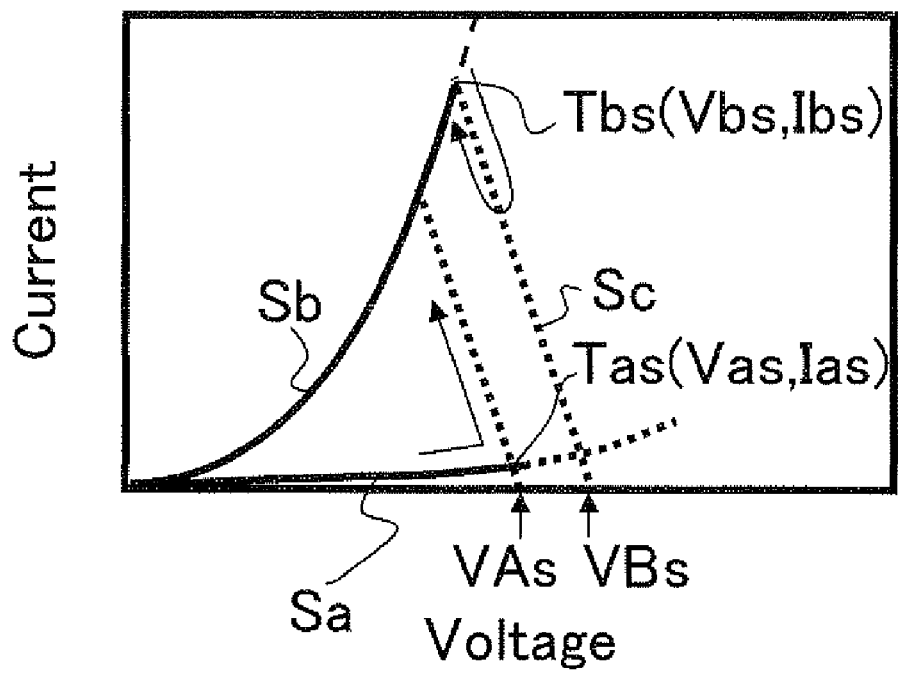
FIG. 19 is a graph showing a resistance characteristic of a variable resistance element capable of implementing a monopolar switching operation.
Figure 19B:
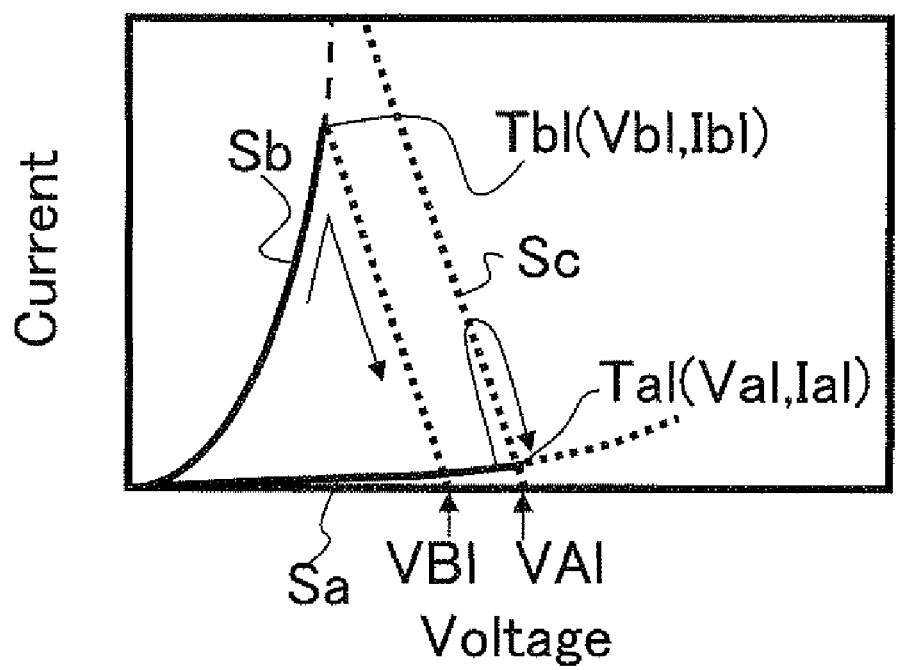

FIG. 4 is a schematic view of a current and voltage characteristic showing a basic resistance change characteristic by voltage application to both electrodes of the variable resistance element having the structure in which the variable resistor is sandwiched between the upper electrode and the lower electrode, and it is provided by further simplifying a graph shown in FIG. 18 for description. According to a characteristic curve shown in FIG. 4, a rectangular voltage pulse is applied to the variable resistance element originally in the high resistance state represented by a resistance characteristic Sa through load resistance (may be the load circuit 14) having a certain resistance value. The resistance characteristic of the variable resistance element is lowered while the voltage pulse is applied and becomes a low resistance state represented by a resistance characteristic Sb. At this time, the voltage applied to the variable resistance element and the current flowing in the variable resistance element moves along a load curve La determined by the current and voltage characteristic of the applied voltage and the load resistance. That is, as the resistance is lowered, the current increases and accordingly, an effective voltage Veff applied to the variable resistance element decreases. Eventually, the resistance change stops when it reaches a certain voltage/current value on the load curve. This final voltage/current value is referred to as a low resistance final point Rta. At this time, variable resistance element after lowered in resistance shows the voltage and current characteristic (the characteristic Sb in FIG. 4) passing through the low resistance final point Rta. Here, the polarity of the applied voltage is represented by the polarity of the upper electrode 24 with respect to the lower electrode 22 (the same is true in the following description).

Figure 5:
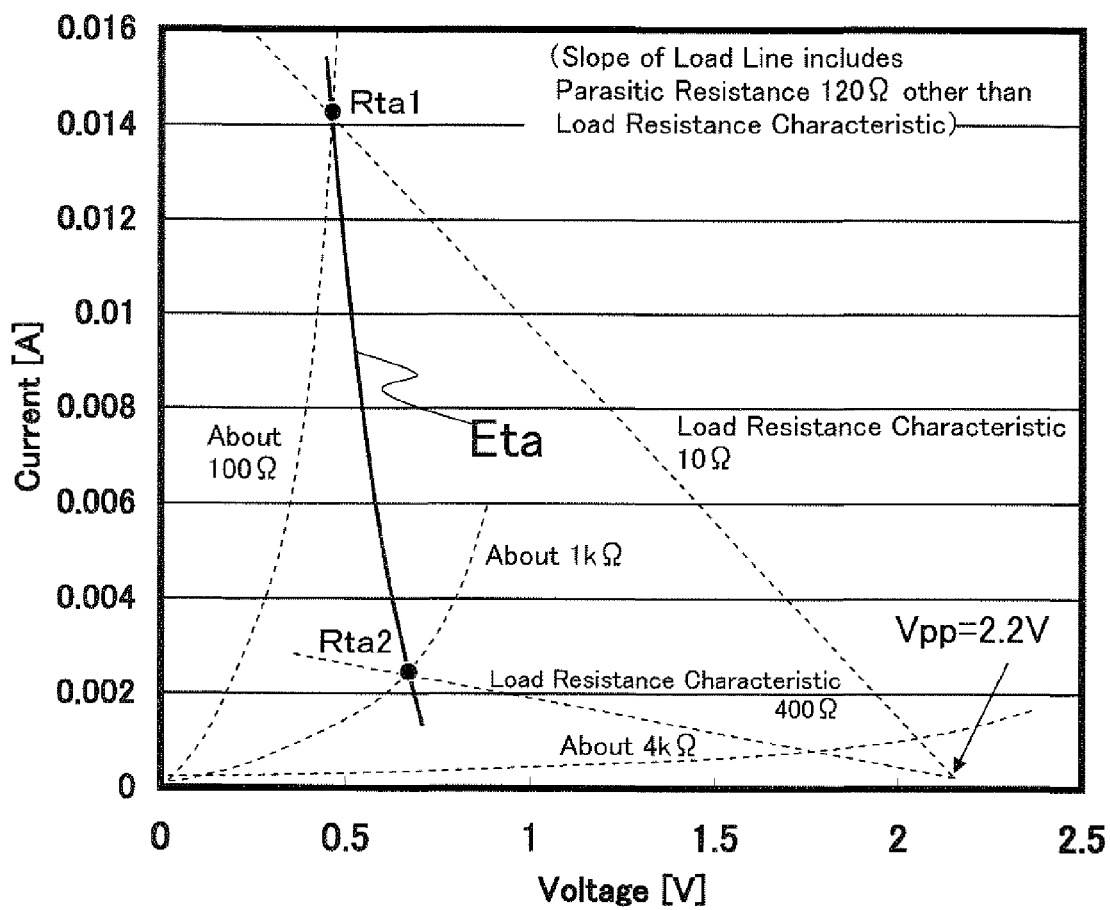
FIG. 5 is a graph showing a low resistance final curve.

Here, the state of the change of the resistance characteristic was measured by applying a voltage pulse under the same condition (voltage=2.2V and pulse width=50 ns) to both ends of a series circuit including the variable resistance element 21 composed of the variable resistor 23 made from titanium oxynitride and the lower electrode 22 and the upper electrode 24 made from platinum, and the load circuit 14 while changing the load resistance characteristic of the load circuit 14. This measured result is shown in FIG. 5. In order to conform the condition of the variable resistance element before the voltage is applied, it is assumed that the resistance value of the resistance characteristic of the variable resistance element before the voltage application is set to show 2 k$\Omega$ when a reading voltage 0.1 V is applied to both ends of the memory cell. In the following variable resistance element also, it is assumed that the resistance characteristic of the variable resistance element is described by the resistance value shown when the reading voltage 0.1 V is applied to both ends of the memory cell.

For example, when the voltage pulse is applied to the series circuit with the load resistance characteristic of the load circuit 14 set to 10$\Omega$, the resistance characteristic of the variable resistance element shows a point Rta1 (about 100$\Omega$), and has made the transition to the low resistance state (2 k$\Omega$→100$\Omega$). In addition, when the voltage is applied similarly with the load resistance characteristic set to 400$\Omega$, the resistance characteristic shows a point Rta2 (about 1 k$\Omega$), and has made the transition to the low resistance state (2 k$\Omega$→1 k$\Omega$). Here, a curve Eta shown in FIG. 5 can be obtained by connecting characteristic points (low resistance final points Rta) showing the resistance characteristics of the variable resistance element provided by applying the voltage while variously changing the load resistance characteristics of the load circuit 14. Since the curve Eta is a curve obtained by connecting the low resistance points Rta, it is referred to as the "low resistance final curve Eta" hereinafter.

In practice, there exist resistance of about 120$\Omega$ due to contact resistance, wiring resistance, parasitic resistance of a measuring system (hereinafter referred to as "the unavoidable resistance") other than the load circuit 14, and even if the load circuit 14 is set to 10$\Omega$, the load resistance is about 130$\Omega$ as a whole. The resistance value of the variable resistance element before and after the voltage application is read by applying the voltage of 0.1 V, and represented as the value excluding the unavoidable resistance. The same is true in FIG. 7 to be described below.

Although the load resistance characteristics of the load circuit 14 can be switched between 10$\Omega$, 200$\Omega$, and 400$\Omega$ (these values are only one example and the load resistance characteristics are not limited to these values) as mentioned in the description of the structure of the present inventive device, the load resistance characteristics assume more than these values in obtaining the graph shown in FIG. 5. The load circuit 14 may be configured to only have the load resistance characteristics changed between the resistance characteristics represented by the resistance values such as 10$\Omega$, 200$\Omega$, and 400$\Omega$ when the programming or erasing actions are performed in the present inventive device, and the load circuit 14 is configured to have the plurality of load resistance characteristics that can be switched only to obtain the graphs shown in FIG. 4 and FIG. 5 that is described below in explaining the new knowledge that is the basis of the description of the operation of the present inventive device.

Referring to FIG. 5, it is understood that the resistance characteristic after the resistance of the variable resistance element is lowered (low resistance final point Rta) is determined by the cross point between the load resistance characteristic, and the low resistance final curve provided by connecting the low resistance final points provided when the resistance is lowered by applying the same voltage as that applied at the time of lowering the resistance. Thus, since each low resistance final point is a characteristic value specifically determined for each variable resistance element based on the load resistance characteristic and the value of the applied voltage, the low resistance final curve is a characteristic curve specifically determined for each variable resistance element. Therefore, the low resistance final curve specific to the variable resistance element is selected based on the value of the applied voltage pulse, and the low resistance final point on the low resistance final curve is selected based on the load resistance characteristic of the load resistance. That is, it means that the resistance value of the variable resistance element in the low resistance state can be easily controlled based on the value of the applied voltage pulse and the load resistance characteristic of the load resistance.

Figure 6:
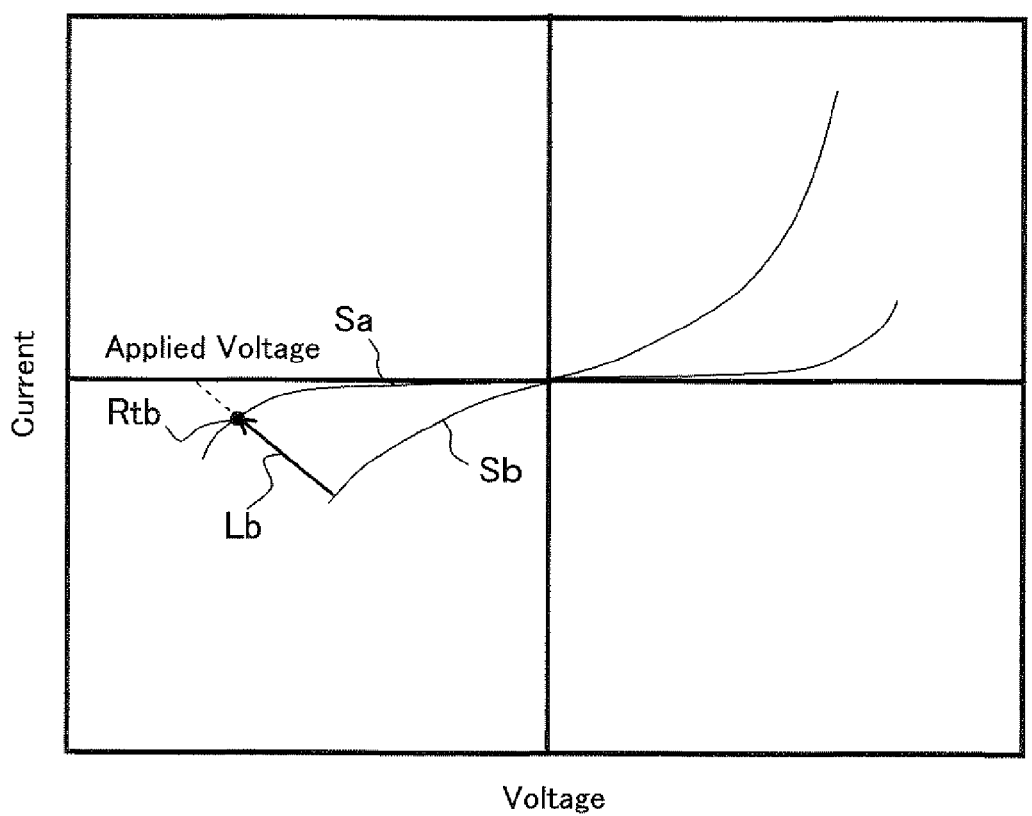
FIG. 6 is a schematic view (2) showing a resistance change characteristic of the variable resistance element.

Similarly, the case where the resistance state of the variable resistance element is heightened is also verified. FIG. 6 shows a current and voltage characteristic showing a basic resistance change characteristic by voltage application when the resistance of the element is heightened. Since the variable resistance element having the characteristics shown in FIGS. 4 and 6 has the bipolar switching characteristic, the resistance state is changed by applying a negative voltage unlike that shown in FIG. 4.

According to a characteristic curve shown in FIG. 6, a rectangular voltage pulse is applied to the variable resistance element originally in the low resistance state represented by the resistance characteristic Sb through the load resistance (may be the load circuit 14) having a certain resistance value. The resistance value of the variable resistance element is heightened while the voltage pulse is applied, and the voltage applied to the variable resistance element and the current flowing in the variable resistance element move along a load curve Lb determined by a current and voltage characteristic of the applied voltage and the load resistance. That is, as the resistance is heightened, the current decreases and accordingly, the effective voltage Veff applied to the variable resistance element increases. Here, the resistance change stops at a certain voltage/current value on the load curve. This voltage/current value is referred to as a "high resistance final point Rtb". Thus, considering that only the moving direction is different from that when the resistance is lowered, it is expected that the variable resistance element comes to have a voltage current characteristic (characteristic Sa in FIG. 6) passing through the high resistance final point Rtb by the pulse application.

Figure 7:
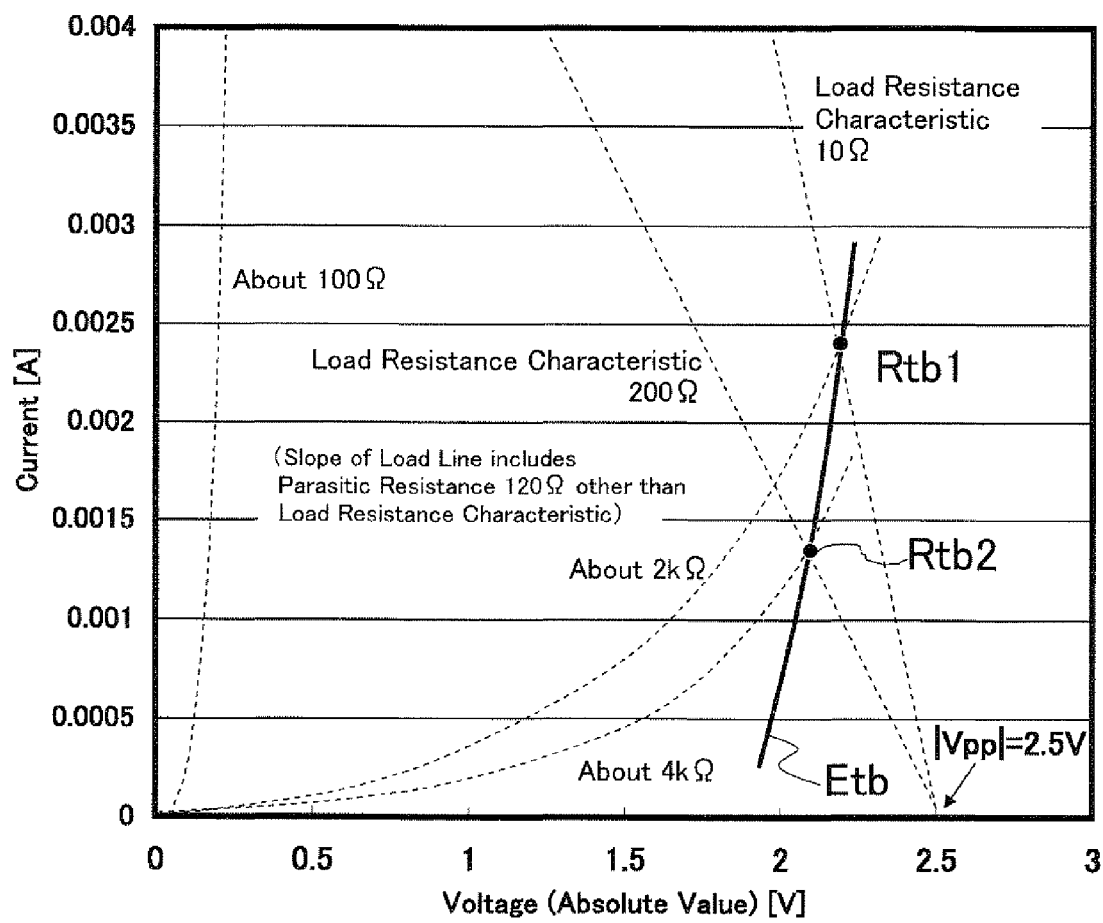
FIG. 7 is a graph showing a low resistance final curve.

Similar to FIG. 5, the state of the change of the resistance characteristic was measured by applying a voltage pulse under the same condition (voltage=−2.5V and pulse width=50 ns) to both ends of the series circuit including the variable resistance element 21 composed of the lower electrode 22 and the upper electrode 24 made from platinum, and the load circuit 14 while changing the load resistance characteristic of the load circuit 14. This measured result is shown in FIG. 7. In order to conform the condition of the variable resistance element before the voltage application, it is assumed that the variable resistance element before the application is set to 100Ω. In FIG. 7, in order to visually conform to FIG. 5, the voltage is represented by an absolute value and the resistance characteristic is shown in the first quadrant.

For example, when the voltage pulse is applied to the series circuit with the load resistance characteristic of the load circuit 14 set to 10Ω, the resistance characteristic of the variable resistance element shows a point Rtb1 (about 2 kΩ), and has made the transition to the high resistance state (100Ω→2 kΩ). When the voltage is applied similarly with the load resistance characteristic set to 200Ω, the characteristic shows a point Rtb2 (about 4 kΩ), and made the transition to the high resistance state (100Ω→4 kΩ). Here, a curve Etb shown in FIG. 7 can be obtained by connecting characteristic points (high resistance final points Rtb) showing the resistance characteristics of the variable resistance element provided by applying the voltage while variously changing the load resistance characteristics of the load circuit 14. Since the curve Etb is a curve obtained by connecting the high resistance points Rtb, it is referred to as the "high resistance final curve Etb" hereinafter.

Referring to FIG. 7, similarly to the case in FIG. 5, it is understood that the resistance characteristic (high resistance final point Rtb) after the resistance of the variable resistance element is heightened is determined by the cross point between the load resistance characteristic, and the high resistance final curve determined as a property value. That is, the load curve can be selected by changing the resistance characteristic of the load resistance and the value of the applied voltage pulse, which means that the resistance value in the high resistance state can be easily controlled.

Specifically, it is thus expected that the resistance characteristic of the variable resistance element can be controlled to both high resistance state and low resistance state by changing the applied voltage and the load resistance characteristic of the load circuit 14, and that the resistance characteristic of the variable resistance element can be switched among three or more different resistance characteristics by setting the applied voltage and the load resistance characteristic under a certain condition.

In view of the expectation, the voltage was applied while changing the voltage applied to the same variable resistance element and the load resistance characteristic of the load circuit 14, and the transition of the resistance characteristic of the variable resistance element was measured.

Figure 8:
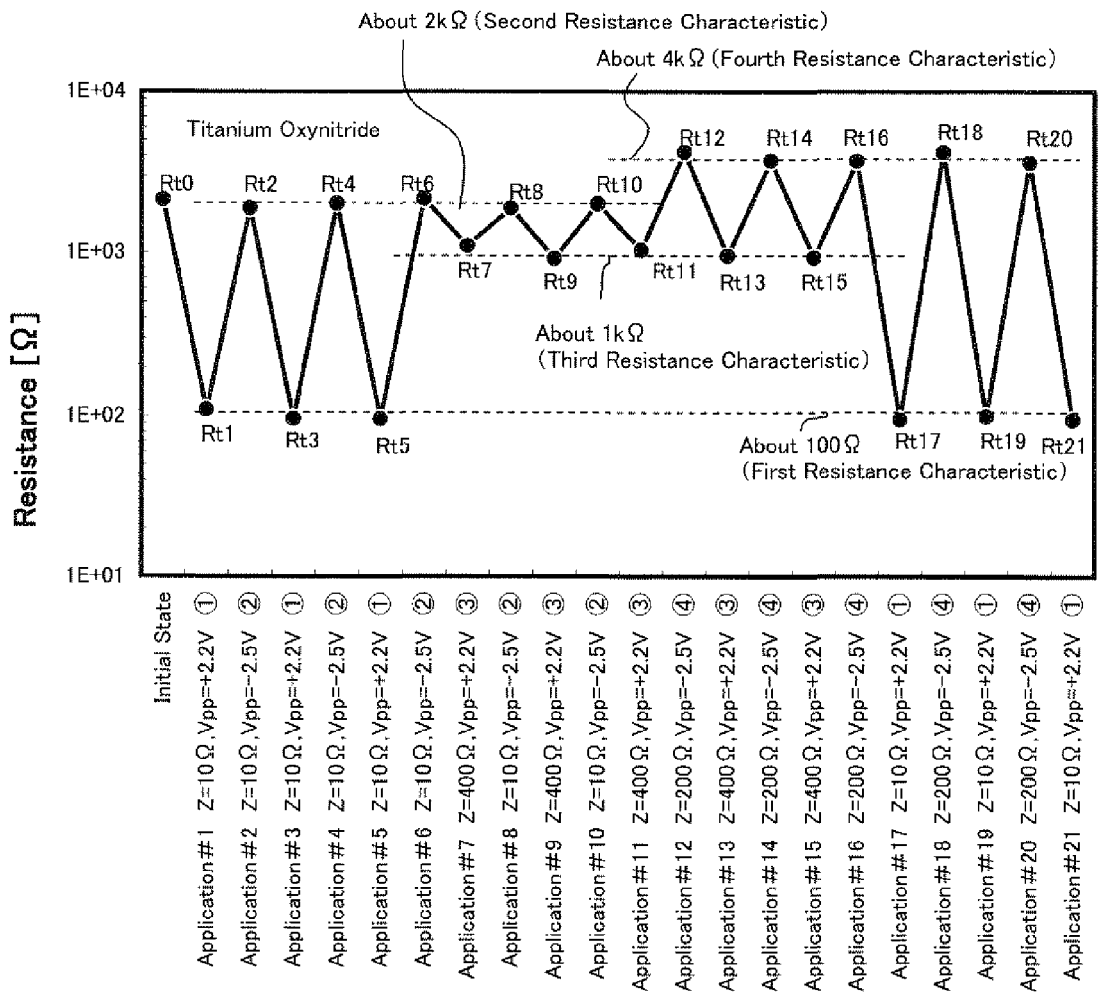
FIG. 8 is a graph showing the transition of the resistance characteristic of a variable resistance element having a variable resistor made from titanium oxynitride.

FIG. 8 shows a graph showing the transition of the resistance characteristic of the variable resistance element 21, which was obtained by connecting the variable resistance element 21 composed of the variable resistor 23 made from titanium oxynitride to the load circuit 14 in series, and applying a voltage to both ends of the series circuit of the variable resistance element 21 and the load circuit 14 while changing one or both of the load resistance characteristic of the load circuit 14 and the voltage generation condition from the voltage generation circuit (voltage switch circuit) 17. In the graph shown in FIG. 8, the load resistance characteristic and the voltage generation condition (both are referred to as the "transition condition" collectively hereinafter) are plotted on a horizontal axis, and the resistance value of the variable resistance element 21 after the voltage application is plotted on a vertical axis. Hereinafter, the load resistance characteristic is represented by Z and the applied voltage is represented by Vpp. In addition, a voltage applying time at each voltage application is 50 ns in common.

For example, in FIG. 8, when the voltage was applied to the series circuit including the variable resistance element having a resistance characteristic Rt0 (about 2Ω) as an initial state under a transition condition in which Z=10Ω and Vpp=+2.2 V (the case where the voltage is applied under this condition is referred to as the "first transition condition" hereinafter and this is represented by a circled number on the horizontal axis of the graph in FIG. 8) (application #1), and then the resistance characteristic of the variable resistance element 21 was measured, the resistance characteristic showed Rt1 (about 100Ω). Next, when the voltage was applied to the series circuit including the variable resistance element having the resistance characteristic Rt1 under a transition condition in which Z=10Ω and Vpp=−2.5 V (the case where the voltage is applied under this condition is referred to as the "second transition condition" hereinafter and this is represented by a circled number on the horizontal axis of the graph in FIG. 8) (application #2), and then the resistance characteristic of the variable resistance element 21 was measured, the resistance characteristic showed Rt2 (about 2 kΩ). Similarly, the voltage applications were repeated under the second transition condition and the first transition condition (application #3 to application #6), and the transitions of resistance characteristics were repeated between about 100Ω and about 2 kΩ (resistance characteristics Rt3 to Rt6).

When the voltage was applied to the series circuit including the variable resistance element having the resistance characteristic Rt6 under a transition condition in which Z=400Ω and Vpp=+2.2 V (the case where the voltage is applied under this condition is referred to as the "third transition condition" hereinafter and this is represented by a circled number on the horizontal axis of the graph in FIG. 8) (application #7), and then the resistance characteristic of the variable resistance element 21 was measured, the resistance characteristic showed Rt7 (about 1 kΩ). Next, when the voltage was applied to the series circuit including the variable resistance element having the resistance characteristic Rt7 under the second transition condition (Z=10Ω and Vpp=−2.5 V) (application #8), and then the resistance characteristic of the variable resistance element 21 was measured, the resistance characteristic showed Rt8 (about 2 kΩ). Similarly, the voltage applications were repeated under the third transition condition and the second transition condition (application #9 to application #11), and the transitions of resistance characteristics were repeated between about 1 kΩ and about 2 kΩ (resistance characteristics Rt9 to Rt11).

When the voltage was applied to the series circuit including the variable resistance element having the resistance characteristic Rt11 under a transition condition in which Z=200Ω and Vpp=−2.5 V (the case where the voltage is applied under this condition is referred to as the "fourth transition condition" hereinafter and this is represented by a circled number on the horizontal axis of the graph in FIG. 8) (application #12), and then the resistance characteristic of the variable resistance element 21 was measured, the resistance characteristic showed Rt12 (about 4 kΩ). Next, when the voltage was applied to the series circuit including the variable resistance element having the resistance characteristic Rt12 under the third transition condition (Z=400Ω and Vpp=+2.2 V) (application #13), and then the resistance characteristic of the variable resistance element 21 was measured, the resistance characteristic showed Rt13 (about 1 kΩ). Similarly, the voltage applications were repeated under the fourth transition condition and the third transition condition (application #14 to application #16), and the transitions of resistance characteristics were repeated between about 4 kΩ and about 2 kΩ (resistance characteristics Rt14 to Rt16).

When the voltage was applied to the series circuit including the variable resistance element having the resistance characteristic Rt16 under the first transition condition (Z=10Ω and Vpp=+2.2 V) (application #17), and then the resistance characteristic of the variable resistance element 21 was measured, the resistance characteristic showed Rt17 (about 100Ω). Next, when the voltage was applied to the series circuit including the variable resistance element having the resistance characteristic Rt17 under the fourth transition condition (Z=200Ω and Vpp=−2.5 V) (application #18), and then the resistance characteristic of the variable resistance element 21 was measured, the resistance characteristic showed Rt18 (about 4 kΩ). Similarly, the voltage applications were repeated under the first transition condition and the fourth transition condition (application #19 to application #21), and the transitions of resistance characteristics were repeated between about 100Ω and about 4 kΩ (resistance characteristics Rt19 to Rt21).

The following conclusions (1) to (4) can be drawn from the transition of the resistance characteristics of the variable resistance element in the applications #1 to #21.

(1) When the voltage is applied to the series circuit of the variable resistance element and the load circuit under the first transition condition, the resistance characteristic makes the transition to the first resistance characteristic (about 100Ω) regardless of whether the resistance characteristic of the variable resistance element is the second resistance characteristic (about 2 kΩ) or the fourth resistance characteristic (about 4 kΩ) (applications #1, #3, #5, #17, #19, and #21).

(2) When the voltage is applied to the series circuit of the variable resistance element and the load circuit under the second transition condition, the resistance characteristic makes the transition to the second resistance characteristic (about 2 kΩ) regardless of whether the resistance characteristic of the variable resistance element is the first resistance characteristic (about 100Ω) or the third resistance characteristic (about 1 kΩ) (applications #2, #4, #6, #8, and #10).

(3) When the voltage is applied to the series circuit of the variable resistance element and the load circuit under the third transition condition, the resistance characteristic makes the transition to the third resistance characteristic (about 1 kΩ) regardless of whether the resistance characteristic of the variable resistance element is the second resistance characteristic (about 2 kΩ) or the fourth resistance characteristic (about 4 kΩ) (applications #7, #9, #11, #13, and #15).

(4) When the voltage is applied to the series circuit of the variable resistance element and the load circuit under the fourth transition condition, the resistance characteristic makes the transition to the fourth resistance characteristic (about 4 kΩ) regardless of whether the resistance characteristic of the variable resistance element is the first resistance characteristic (about 100Ω) or the third resistance characteristic (about 1 kΩ) (applications #12, #14, #16, #18, and #20).

According to the above results, the variable resistance element 21 can make the transition to the different first to fourth resistance characteristics by setting the transition condition properly. Therefore, the nonvolatile semiconductor device using the variable resistance element as the memory cell can store information having up to different four values by relating the different information to the resistance characteristics, respectively. The variable resistance element after transition keeps its resistance state until the voltage is applied under the new transition condition.

Referring to the result shown in FIG. 8, the transition between the first resistance characteristic and the second resistance characteristic is implemented by changing the polarities of the applied voltage without changing the load resistance characteristic, and this corresponds to the conventional transition of the resistance characteristic using the bipolar switching characteristic. According to the present invention, in addition to this conventional configuration, the transition to the third and fourth resistance characteristics can be implemented by controlling the applied voltage to both ends of the series circuit and the load resistance characteristic. Thus, a multilevel storage memory cell having three or more values can be implemented by making the applied voltage and the load resistance characteristic controllable in the conventional binary storage memory cell using the bipolar switching characteristic.

Although the direct transition between the first resistance characteristic and the third resistance characteristic, and the direct transition between the second resistance characteristic and the fourth resistance characteristic cannot be implemented in the above example, in this case, when the writing is performed from information i1 related to the first resistance characteristic to information i3 related to the third resistance characteristic, for example, the writing from the information i1 to i3 can be performed by making the transition from the first resistance characteristic to the second or fourth resistance characteristic and then making the transition to the third resistance characteristic. This is similar to the case where the writing is performed from information i2 related to the second resistance characteristic to information i4 related to the fourth resistance characteristic. However, when the variable resistance element having the characteristics as shown in the above example is used as the memory cell, the frequently combined information for the transition is related to the combination of the resistance characteristics in which the transition can be directly implemented, whereby a time required for the information writing can be saved.

The numeric values of the transition conditions and the resistance characteristics are only one example, and the present invention is not limited thereto. Although the description has been made of the case where the different four resistance characteristics can be assumed in the variable resistance element in the above case, this value is not also limited to four. In other words, when the variable resistance element shows three or more different resistance characteristics based on the transition conditions after voltage application under setting the transition conditions properly, information having three or more values can be stored in each memory cell. That is, when the memory cell has the variable resistance element showing eight different resistance characteristics after voltage application under eight different transition conditions, information having eight different values can be stored in each memory cell. Thus, the high-capacity semiconductor memory device can be realized while preventing its occupied space from being increased. In this case, although the load resistance characteristics of the load circuit 14 can be switched among three values of 10Ω, 200Ω, and 400Ω in the above example, the load resistance characteristic may be switched to one properly selected from the load resistance characteristics having four or more values. As for the voltage generation condition, although the description has been made assuming that it is switched between +2.2V and −2.5V in the above example, one voltage properly selected from different voltages having three or more values may be applied.

The load circuit 14 is not necessarily provided in each memory cell, and one load circuit may be provided for the plurality of memory cells. For example, the load circuit 14 may be provided for each word line.

Figure 9:
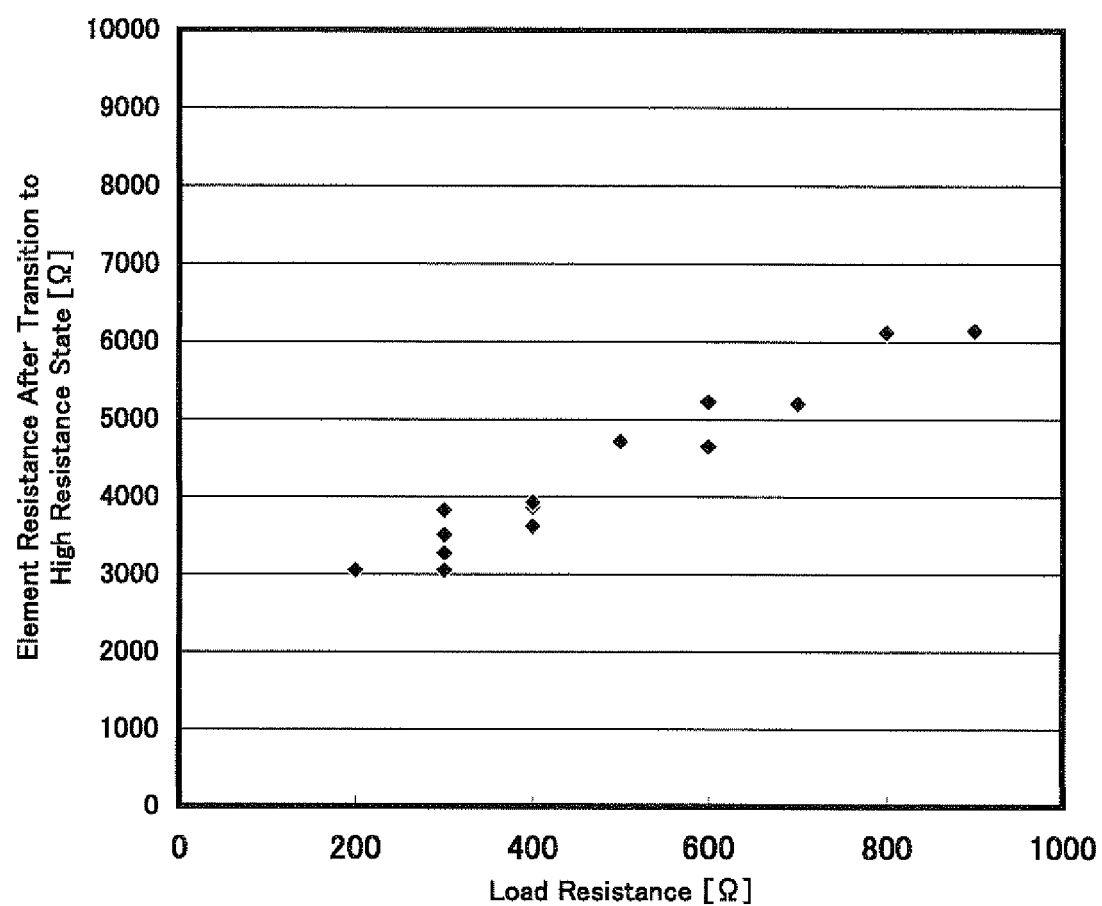
FIG. 9 is a graph showing the resistance characteristic of the variable resistance element provided by applying a voltage under the same generation condition while changing a load resistance characteristic.

Here, referring to the data shown in FIG. 8, when comparing the first transition condition with the third transition condition or the second transition condition with the fourth transition condition that have the same voltage generation condition, the resistance characteristic of the variable resistance element shows the higher resistance state when the voltage is applied under the transition condition having the greater load resistance characteristic (third resistance characteristic (1 kΩ)>first resistance characteristic (100Ω), and fourth resistance characteristic (4 kΩ)>second resistance characteristic (2 kΩ)). FIG. 9 is a graph showing the resistance characteristic of the variable resistance element provided by applying the voltage under the same voltage generation condition (voltage −2.5V and pulse width 50 ns) while changing the load resistance characteristic, and it is clear from this graph that the greater the load resistance characteristic is, the higher the resistance of the variable resistance element is.

Meanwhile, the patent document 2 discloses that as a verifying method, when the resistance is not sufficiently heightened in the step of heightening the resistance, the resistance of the element is heightened by boosting a gate voltage. This description disagrees with the contents of the result shown in FIG. 8 or 9 (boosting the gate voltage causes the load resistance characteristic to be reduced). That is, it is to be noted that the described contents in the patent document 2 only suggests that when the resistance value is not sufficiently heightened because the voltage lower than the threshold voltage for heightening the resistance is applied, only one region in the variable resistance element is heightened in resistance and the other regions are still in the low resistance state in some cases, and in this state, a higher voltage can be applied by boosting the gate voltage of the selection transistor, so that large region can be heightened in resistance by applying the voltage capable of causing the resistance change in the region where the resistance change did not occur and as a result, the resistance is mostly heightened in some cases, which is totally different in main purpose and method from the resistance control method of the present invention in which the resistance characteristic (heightened in this case) of the variable resistance element is controlled according to the cross point between the high resistance final curve Etb and the load resistance characteristic.

Second Embodiment

Hereinafter, described is a second embodiment of the present inventive device and the present inventive method with reference to FIG. 10 hereinafter. This embodiment is only different from the first embodiment in the configuration of the load circuit 14, and the other configurations are the same as those in the first embodiment. The part different from the first embodiment is only described hereinafter, and the description for the same part as that in the first embodiment is omitted.

According to this embodiment, the load circuit 14 is composed of one or more MOS transistors instead of polycrystalline silicon used in the first embodiment, and when the gate voltage of the MOS transistor is controlled by the control circuit 16, the load resistance (conduction resistance) of the MOS transistor is controlled. The control circuit 16 changes the gate voltage of the MOS transistor according to the designated writing process to make the load resistance of the MOS transistor have the load resistance characteristic to satisfy the transition condition required for the previously registered writing process, whereby the load resistance of the MOS transistor shows the designated load resistance characteristic. Hereinafter, the transistor is occasionally referred to as the "transistor 14".

Figure 10:
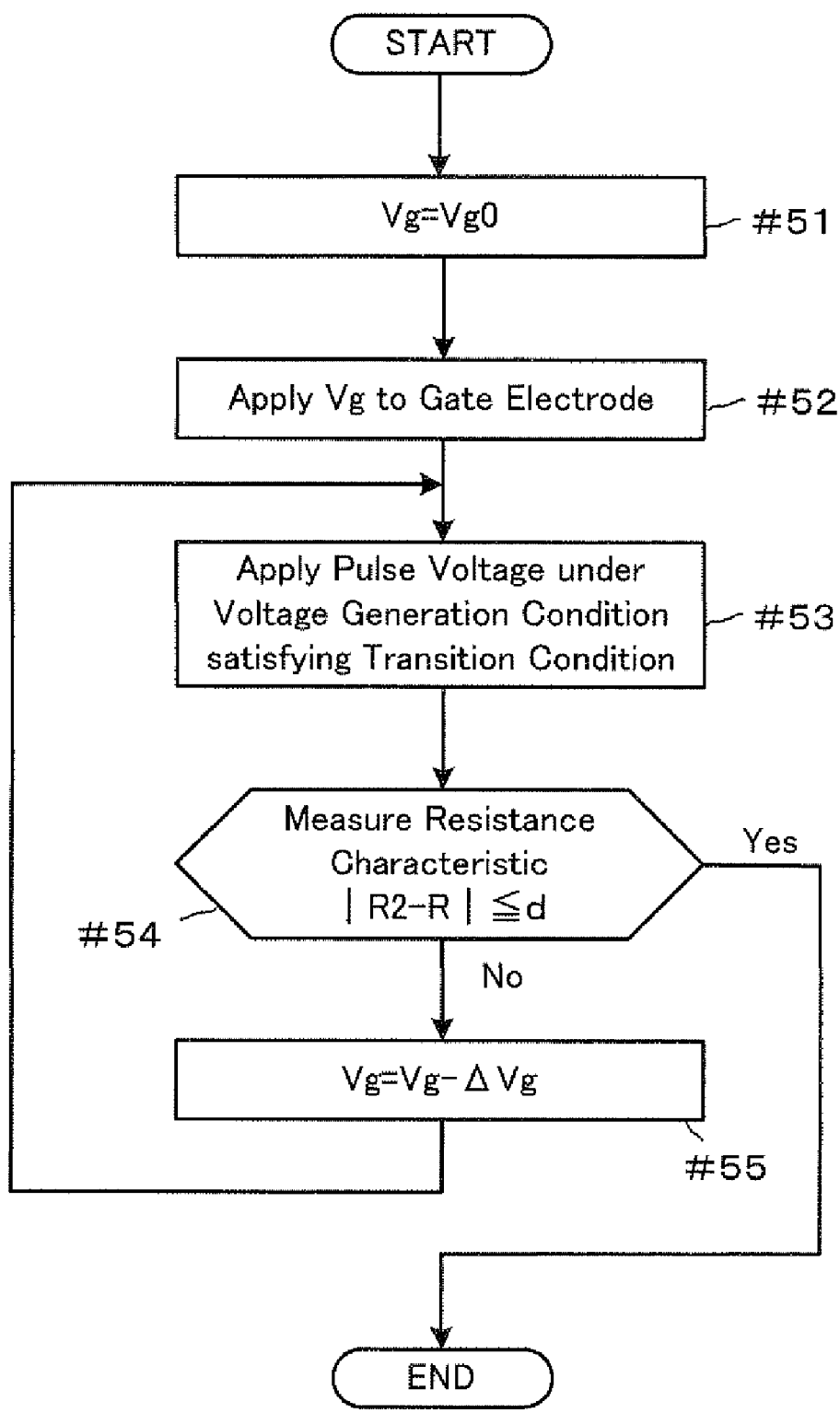
FIG. 10 is a flowchart showing a process method when the resistance characteristic of the variable resistance element is changed in a nonvolatile semiconductor memory device according to a second embodiment of the present invention.

In such configuration, described is a process to change the resistance characteristic of the variable resistance element with reference to a flowchart shown in FIG. 10. Hereinafter, described is a process to make the transition from the first resistance characteristic to the second resistance characteristic (heighten the resistance) with reference to the example of the first embodiment. In addition, described is hereinafter assuming that when the variable resistance element shows the second resistance characteristic, the memory cell having such variable resistance element is in the erasing state.

According to this embodiment, unlike the first embodiment, since the switching control of the load resistance characteristic is made by controlling the on-state resistance of the transistor, the load resistance characteristic can be finely controlled by changing the gate voltage. Meanwhile, there is a possibility that the load resistance characteristic fulfilling the transition condition based on the designated gate voltage is not satisfied depending on the characteristic of the transistor, and the variable resistance element is not changed to the target resistance characteristic even after the voltage is applied to the series circuit.

Therefore, the range of the gate voltage capable of implementing the load resistance characteristic satisfying the transition condition required for the transition to the target resistance characteristic is previously measured, and the voltage application is repeated until the resistance characteristic is changed while slightly increasing the voltage sequentially from a lower limit value of the gate voltage, or the voltage application is repeated until the resistance characteristic is changed while slightly decreasing the voltage sequentially from an upper limit value of the gate voltage. At this time, as for whether the gate voltage is gradually increased from the lower limit value or the gate voltage is gradually decreased from the upper limit, it may differ between the case where the resistance characteristic of the variable resistance element is heightened and the case where it is lowered. Hereinafter, described is the case where the resistance state is changed by applying the voltage to the series circuit while sequentially decreasing the gate voltage (where the resistance of the variable resistance element is heightened, that is, the erasing process is performed), for example.

When the erasing process is performed for one memory cell, a gate voltage Vg to be applied to a gate electrode of the transistor 14 is set to a certain reference voltage Vg0 (step #51), and the gate voltage Vg is applied to the gate electrode (step #52). This reference voltage Vg0 is a maximum voltage required for the transistor 14 to implement the load resistance characteristic satisfying the second transition condition required for the transition to the second resistance characteristic, as described above.

Under such condition, the voltage is applied from the voltage generation circuit 17 to the series circuit under the voltage generation condition satisfying the second transition condition (−2.5V in the above example) (step #53). Then, the resistance value of the variable resistance element provided in the target memory cell is read by the readout circuit 15, and determined on whether the transition is made to the second resistance characteristic properly. When the difference between a resistance value R after the voltage application and a resistance value R2 according to the second resistance characteristic (about 2 kΩ in the above example) is a predetermined small value d or less (Yes in step #54), it is determined that the transition has been made properly to the second resistance characteristic, and the voltage application process is completed. Meanwhile, when the resistance difference is greater than the value d, that is, when the resistance has not been properly heightened (No in step #54), the gate voltage is decreased by a predetermined small voltage ΔVg (step #55), the voltage is applied to the series circuit again with the load resistance characteristic of the transistor 14 slightly increased (step #53). The process for decreasing the gate voltage and the voltage application process to the series circuit are repeated until the difference between the resistance value R and the resistance value R2 becomes the value d or less. Thus, even if the variable resistance element cannot have the target resistance characteristic by the one pulse voltage application, the transition can be made to the target resistance characteristic by the two or more pulse voltage applications.

When the measured resistance value R is within a certain range of values that is largely departing from the target resistance value R2 in step #54, the voltage is applied under the different transition condition once to change the resistance characteristic to a different characteristic, and then steps #51 to #54 (and step #55) may be performed. For example, in the case shown in FIG. 8, the resistance characteristic of the variable resistance element before the pulse voltage application could be the fourth resistance characteristic (about 4 kΩ). In this case, the transition cannot be made to the second resistance characteristic even if the voltage is applied under the second transition condition. That is, in step #54, it is determined whether the resistance value R is within the range of the resistance values that cannot be changed to the second resistance characteristic by the voltage application under the second transition condition, and when the resistance value belongs to the above range, the voltage is applied under the transition condition (first transition condition, for example) that is different from the second transition condition to change the resistance characteristic to the different resistance characteristic (first resistance characteristic in this case), and then steps #51 to #54 (and step #55) are performed. Thus, the resistance controllability of the variable resistance element is improved.

Another Embodiment

Another embodiment of the present inventive device is described hereinafter.

(1) Although each memory cell includes the variable resistance element having the bipolar switching characteristic in which the resistance characteristic is changed by the positive and negative bipolar pulse voltage application in the above embodiment, the resistance characteristic may be changed by only one positive or negative voltage application. In this case, in addition to the control of the load resistance characteristic, the resistance characteristic may be changed by changing the applying time of the pulse voltage.

In this case, each memory cell may have a 1D1R type cross point structure in which a variable resistance element and a diode are combined.

Figure 11A:
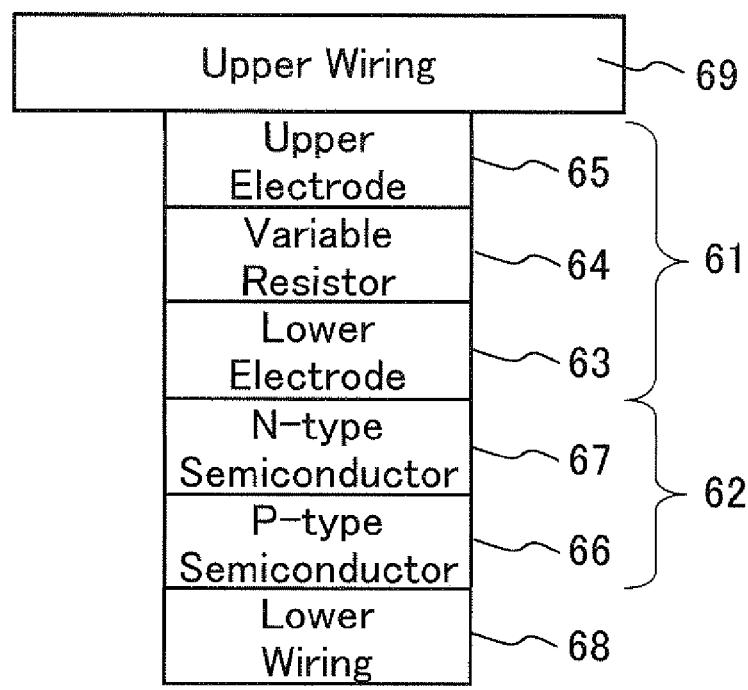
FIG. 11 is views showing a schematic structure and an equivalent circuit of a 1D1R type variable resistance element.
Figure 11B:
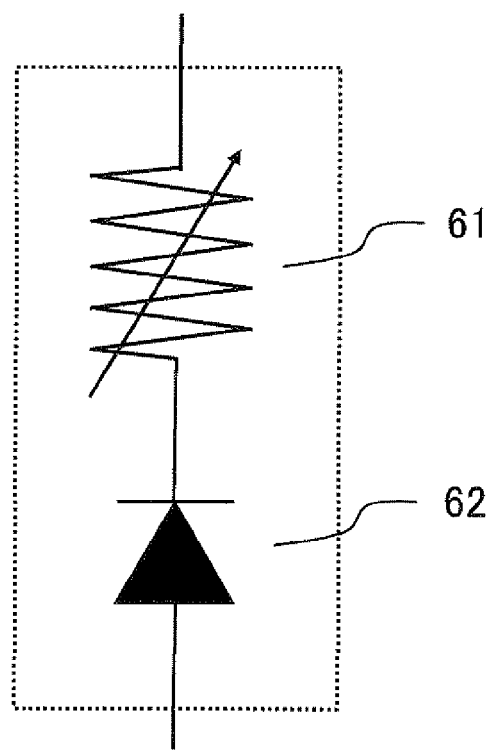
Figure 12:
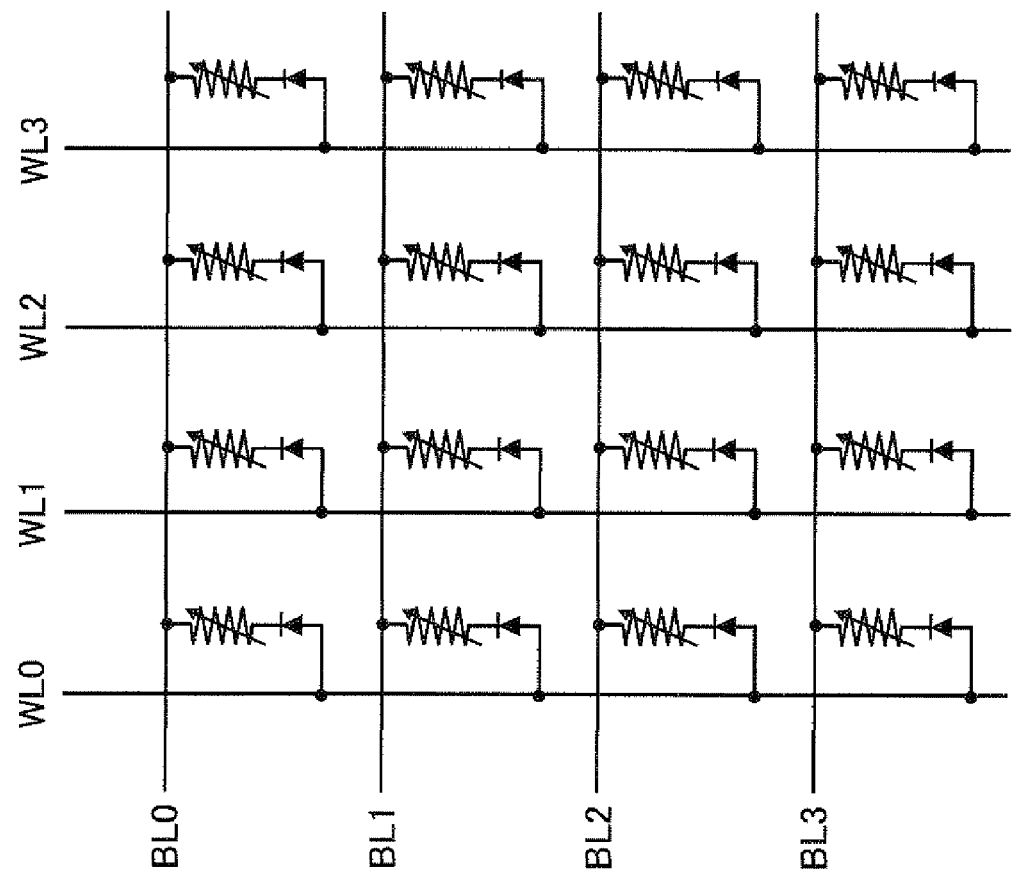
FIG. 12 is a view showing a partial configuration of a memory cell array having a 1D1R type variable resistance element in a memory cell.

FIG. 11A is a schematic diagram of a 1D1R structure in which a variable resistance element 61 and a diode 62 are connected in series, and FIG. 11B is an equivalent circuit diagram of FIG. 11A, and FIG. 12 is a schematic view of a cell array of the 1D1R cross point structure. As shown in FIG. 11A, the variable resistance element 61 having a three-layer structure composed of a lower electrode 63, a variable resistor 64, and an upper electrode 65, and the diode 62 composed of a PN junction of a P-type semiconductor layer 66 and an N-type semiconductor layer 67 are vertically connected in series. The P-type semiconductor layer 66 and the N-type semiconductor layer 67 are formed by injecting P-type and N-type impurities in silicon, respectively. In FIG. 12, the memory cells are provided at cross points between four bit lines BL0 to BL3 and four word lines WL0 to WL3. Since the 1D1R cross point structure can prevent leak current, it is suitable for high integration. However, since bipolar switching cannot be implemented due to the series structure with the diode, the operation needs to be a monopolar switching.

In addition to the configuration including both semiconductor layers of the P-type semiconductor layer and the N-type semiconductor layer, a diode may be configured such that Schottky connection is formed at the interface between either P-type or N-type semiconductor layer and the electrode.

(2) Although the configuration of the present inventive device can be applied to the 1R or 1D1R type memory cell as described in the above embodiments and another embodiment 1, it can be applied to a 1T1R type memory cell.

Figure 13:
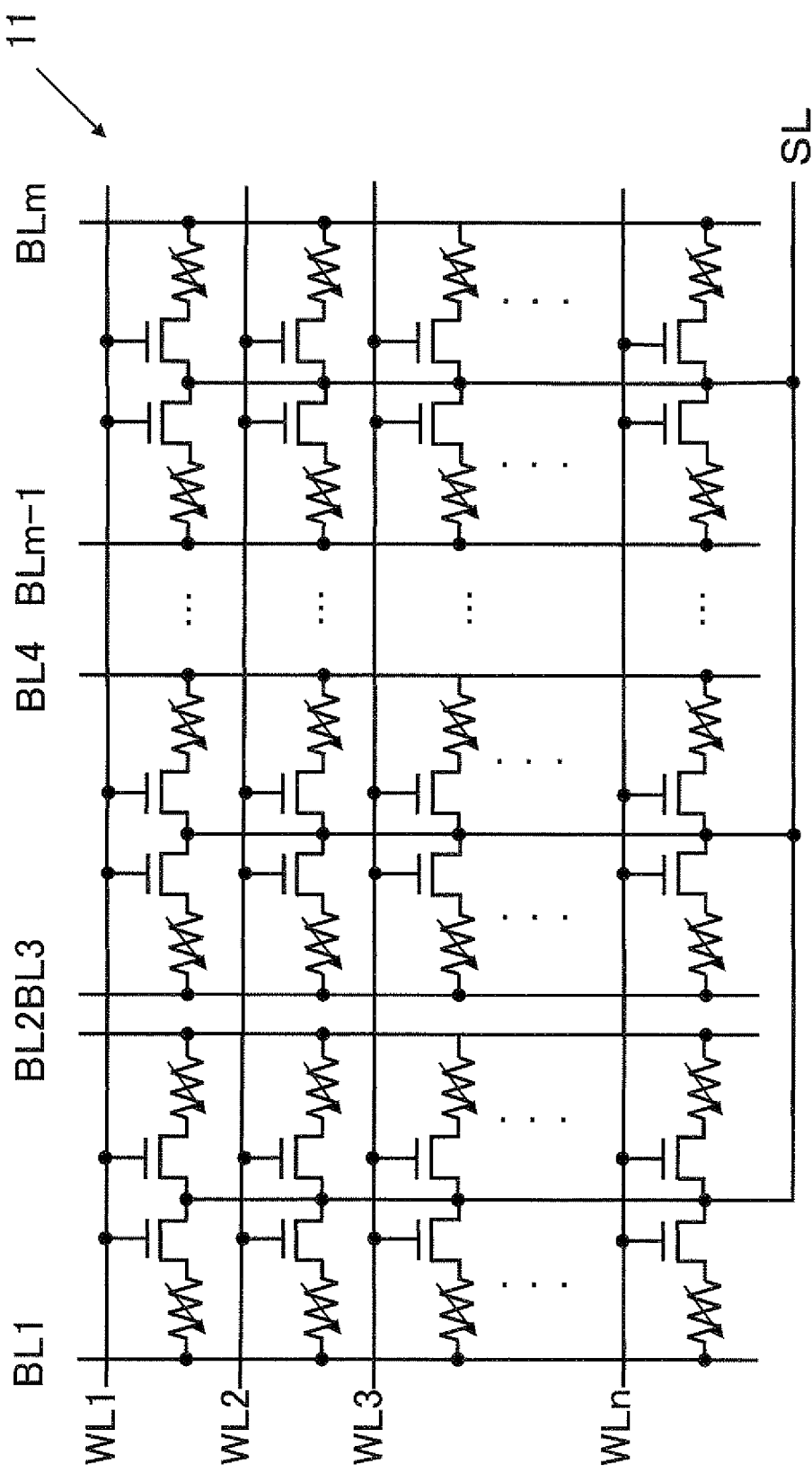
FIG. 13 is a circuit diagram showing a partial configuration of a memory cell array 11 using a 1T1R type memory cell shown in FIG. 13.

FIG. 13 schematically shows a partial configuration of a memory cell array 11 in which 1T1R type memory cells are arranged in the form of a matrix. Referring to FIG. 13, gates of selection transistors of the memory cells are connected to word lines (WL1 to WLn), and sources of the selection transistors of the memory cells are connected to a common source line SL, and one ends (the upper electrode side) of the variable resistance elements of the memory cells are connected to the bit lines (BL1 to BLm). Since the variable resistance element of each memory cell assumes a monopolar switching operation in the configuration shown in FIG. 13, the ground voltage is applied to the source line in each memory action of programming, erasing, and reading. Therefore, since it is not necessary to switch a source line voltage based on the kind of the memory action, the voltage can be directly fixed to the ground voltage without passing through the voltage switch circuit 17 for switching the source line voltage. In the case of the bipolar switching operation, in order to reverse the polarity of the source line voltage, a certain voltage may be selectively applied to the source line through the voltage switch circuit 17 and a source line decoder (not shown).

Figure 14A:
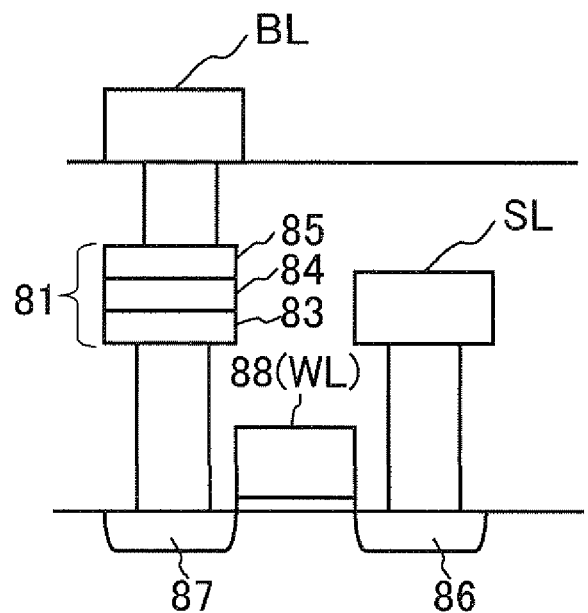
FIG. 14 is a schematic vertical cross-sectional view showing one configuration example of the 1R1T type memory cell and its equivalent circuit.
Figure 14B:
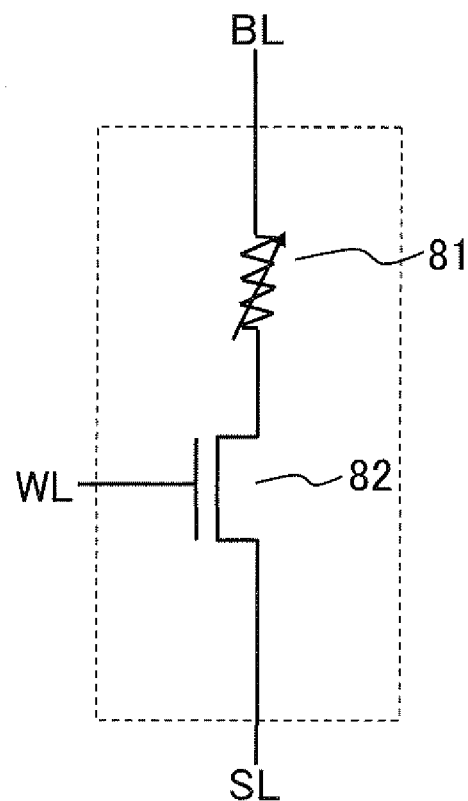

FIG. 14A shows a schematic cross-sectional structure of the 1T1R type memory cell. The memory cell composing the memory cell array 11 includes a selection transistor 82 composed of a source region 86 and a drain region 87 formed on a semiconductor substrate, and a gate electrode 88 formed on a gate oxide film; and a variable resistance element 81 having a three-layer laminated structure composed of a lower electrode 83, a variable resistor 84, and an upper electrode 85; in which the drain region 87 of the selection transistor 82 is electrically connected to the lower electrode 83 of the variable resistance element 81, and the selection transistor 82 and the variable resistance element 81 form a series circuit. The gate electrode 88 is connected to a word line WL, the source region 86 is connected to a source line SL, and the upper electrode 85 is connected to a bit line BL. The variable resistor 84 is made from TiON provided by oxidizing TiN, and both the upper electrode and the lower electrode are made from TiN. FIG. 14B is an equivalent circuit diagram of the 1T1R type memory cell of the cross-sectional structure shown in FIG. 14A.

Even in this configuration, the resistance characteristic of the variable resistance element composing the memory cell can be changed by applying a certain voltage satisfying a transition condition to a selected bit line or a selected word line connected to a target memory cell, with the load resistance characteristic of a load circuit set to a predetermined condition.

In addition, here, the configuration may use the on-state resistance of the selection transistor as the load circuit. In this case, the load circuit assumes to be contained in the memory cell array 11. At this time, the load resistance characteristic is changed based on the value of the pulse voltage applied to the gate electrode of the selection transistor.

Figure 15:
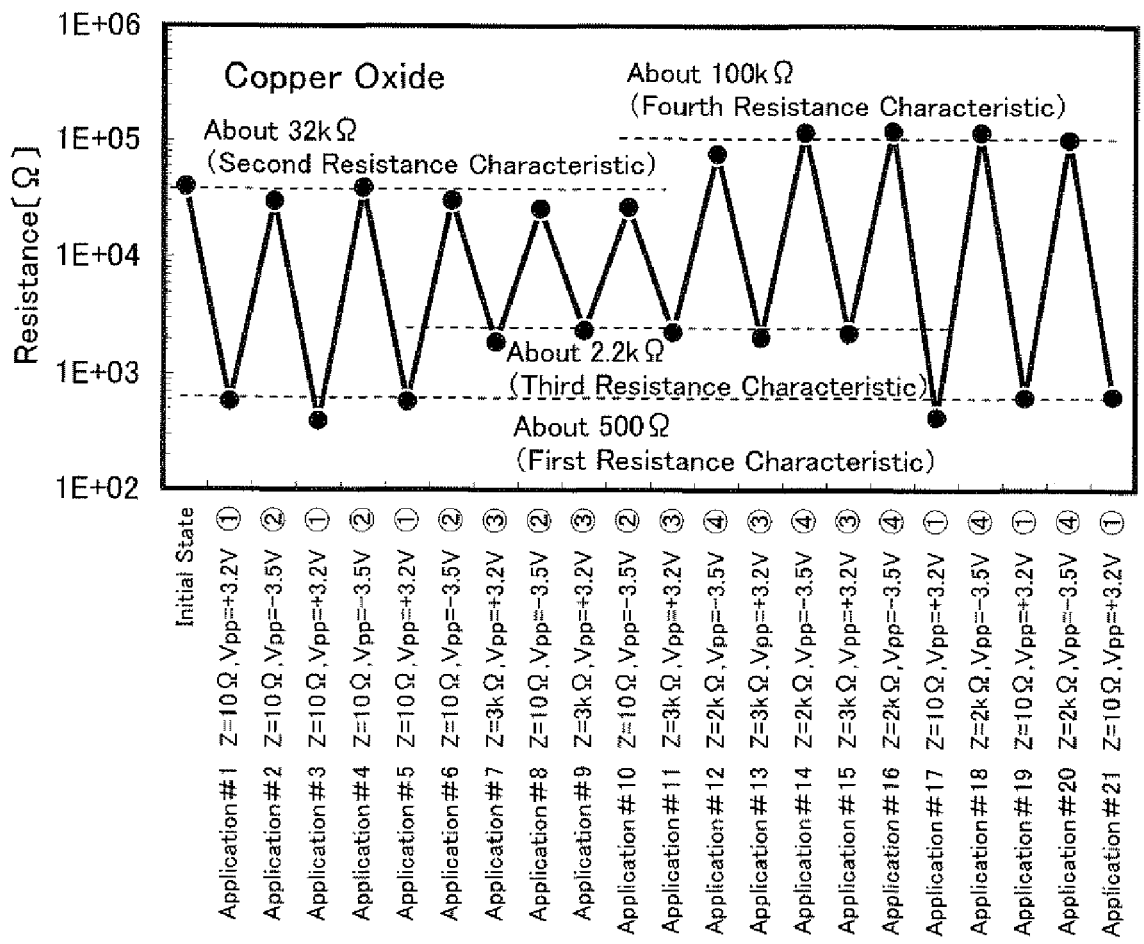
FIG. 15 is a graph showing the transition of the resistance characteristic of a variable resistance element having a variable resistor made from copper oxide.

(3) Although the variable resistor 23 composing the variable resistance element 21 is made from titanium oxynitride in the above embodiment, it may be made from another metal oxide. FIG. 15 is a graph showing the transition of a resistance characteristic when a variable resistor of the variable resistance element is made from copper oxide, and FIG. 16 is a graph showing the transition of a resistance characteristic when a variable resistor of the variable resistance element is made from nickel oxide.

Figure 16:
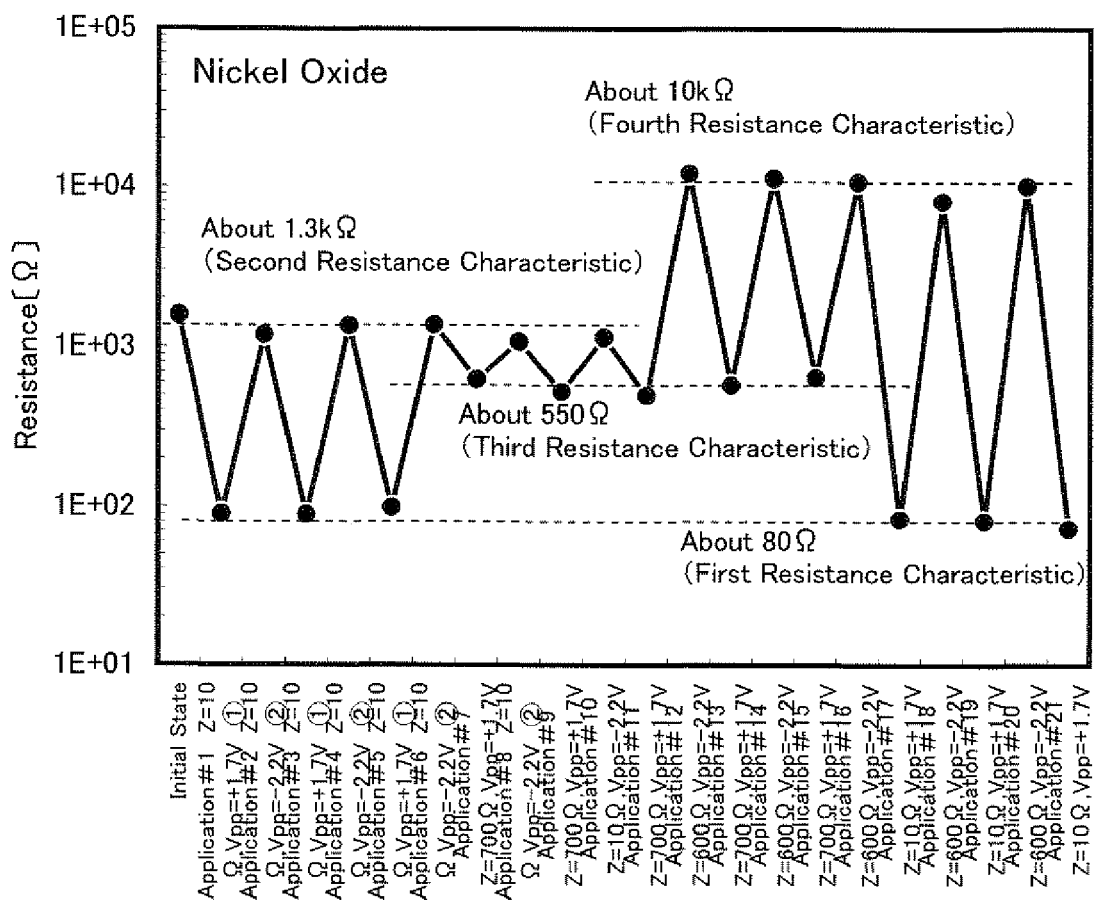
FIG. 16 is a graph showing the transition of the resistance characteristic of a variable resistance element having a variable resistor made from nickel oxide.
Figure 17:
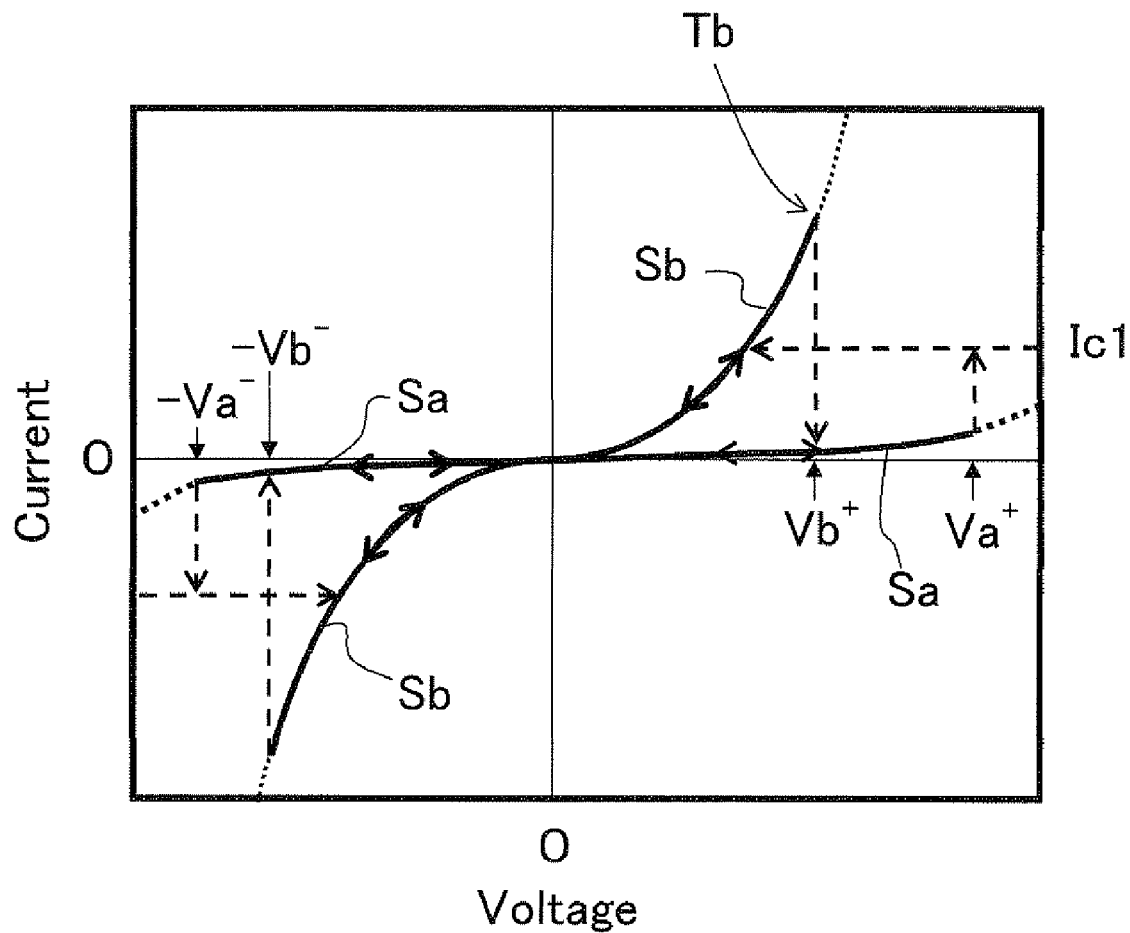
FIG. 17 is a graph showing a current and voltage characteristic showing a basic resistance change characteristic by voltage application to both electrodes in a variable resistance element having a structure in which a variable resistor is sandwiched between an upper electrode and a lower electrode.

As shown in FIGS. 15 and 16, even if the variable resistor is made from copper oxide or nickel oxide, similar to the case of titanium oxynitride shown in FIG. 8, four different resistance characteristics (referred to as first to fourth resistance characteristics similar to the case of titanium oxynitride hereinafter) can be provided by applying the voltage under four different transition conditions (referred to as first to fourth transition conditions similar to the case of titanium oxynitride).

Specifically, in the case of copper oxide (FIG. 15), (1) the resistance characteristic is changed to the first resistance characteristic (about 500Ω) by applying the voltage to the series circuit of the variable resistance element and the load circuit under the first transition condition ($Z=10\Omega$ and $Vpp=+3.2$ V) regardless of whether the resistance characteristic shows the second resistance characteristic (about 32 kΩ) or the fourth resistance characteristic (about 100 kΩ), (2) the resistance characteristic is changed to the second resistance characteristic (about 32 kΩ) by applying the voltage to the series circuit of the variable resistance element and the load circuit under the second transition condition ($Z=10\Omega$ and $Vpp=-3.5$ V) regardless of whether the resistance characteristic shows the first resistance characteristic (about 500Ω) or the third resistance characteristic (about 2.2 kΩ), (3) the resistance characteristic is changed to the third resistance characteristic (about 2.2 kΩ) by applying the voltage to the series circuit of the variable resistance element and the load circuit under the third transition condition ($Z=3$ kΩ and $Vpp=+3.2$ V) regardless of whether the resistance characteristic shows the second resistance characteristic (about 32 kΩ) or the fourth resistance characteristic (about 100 kΩ), and (4) the resistance characteristic is changed to the fourth resistance characteristic (about 100 kΩ) by applying the voltage to the series circuit of the variable resistance element and the load circuit under the fourth transition condition ($Z=2$ kΩ and $Vpp=-3.5$ V) regardless of whether the resistance characteristic shows the first resistance characteristic (about 500Ω) or the third resistance characteristic (about 2.2 kΩ).

Similarly, in the case of nickel oxide (FIG. 16), (1) the resistance characteristic is changed to the first resistance characteristic (about 80Ω) by applying the voltage to the series circuit of the variable resistance element and the load circuit under the first transition condition ($Z=10\Omega$ and $Vpp=+1.7$ V) regardless of whether the resistance characteristic shows the third resistance characteristic (about 550Ω) or the fourth resistance characteristic (about 10 kΩ), (2) the resistance characteristic is changed to the second resistance characteristic (about 1.3 kΩ) by applying the voltage to the series circuit of the variable resistance element and the load circuit under the second transition condition ($Z=10\Omega$ and $Vpp=-2.2$ V) regardless of whether the resistance characteristic shows the first resistance characteristic (about 80Ω) or the third resistance characteristic (about 550Ω), (3) the resistance characteristic is changed to the third resistance characteristic (about 550 kΩ) by applying the voltage to the series circuit of the variable resistance element and the load circuit under the third transition condition ($Z=700\Omega$ and $Vpp=+1.7$ V) regardless of whether the resistance characteristic shows the second resistance characteristic (about 1.3 kΩ) or the fourth resistance characteristic (about 10 kΩ), and (4) the resistance characteristic is changed to the fourth resistance characteristic (about 10 kΩ) by applying the voltage to the series circuit of the variable resistance element and the load circuit under the fourth transition condition ($Z=600\Omega$ and $Vpp=-2.2$ V) regardless of whether the resistance characteristic shows the first resistance characteristic (about 80Ω) or the third resistance characteristic (about 550Ω).

Thus, even if the variable resistance element 21 is made from copper oxide or nickel oxide, the resistance characteristic can be changed to the different resistance characteristics such as the first to fourth resistance characteristics by properly setting the transition conditions. Therefore, the nonvolatile semiconductor device using the variable resistance element as the memory cell can store information having up to four values by relating different information to the resistance characteristics, respectively. By referring to the results in FIGS. 8, 15, and 16, it is estimated that the resistance characteristic can be also controlled in general by changing the applied voltage and the load resistance characteristic in the metal oxide that assumes the conventional switching operation. That is, even if another material is used as the material of the variable resistance element, it is considered that the memory cell can implement the multilevel storage similarly.

The invention claimed is:
1. A nonvolatile semiconductor memory device comprising:
a memory cell array composed of a plurality of memory cells each including a variable resistance element having a two-terminal structure in which a resistance characteristic defined by a current and voltage characteristic at both ends is changed by applying a voltage satisfying a predetermined condition to the both ends, and information related to the resistance characteristic can be stored;

a load circuit connected to one terminal of the variable resistance element in series; and a voltage generation circuit for applying a voltage to both ends of a series circuit of the variable resistance element and the load circuit, wherein the load circuit is configured to controllably change a load resistance characteristic defined by a current and voltage characteristic, the voltage generation circuit is configured to controllably change a voltage generation condition of a voltage generated from the voltage generation circuit, the variable resistance element is configured so that the resistance characteristic transits to one resistance characteristic determined from at least four different resistance characteristics of a first resistance characteristic, a second resistance characteristic, a third resistance characteristic, and a fourth resistance characteristic in response to application of the voltage generated from the voltage generation circuit to the series circuit, based on the load resistance characteristic of the load circuit and the voltage generation condition from the voltage generation circuit, when the voltage generated from the voltage generation circuit is applied to the series circuit of the variable resistance element and the load circuit, the variable resistance element showing the second resistance characteristic, with the load resistance characteristic and the voltage generation condition set to a predetermined first transition condition, the variable resistance element transits to the first resistance characteristic, when the voltage generated from the voltage generation circuit is applied to the series circuit of the variable resistance element and the load circuit, the variable resistance element showing the fourth resistance characteristic, with the load resistance characteristic and the voltage generation condition set to the first transition condition, the variable resistance element transits to the first resistance characteristic, when the voltage generated from the voltage generation circuit is applied to the series circuit of the variable resistance element and the load circuit, the variable resistance element showing the first resistance characteristic, with the load resistance characteristic and the voltage generation condition set to a predetermined second transition condition, the variable resistance element transits to the second resistance characteristic, when the voltage generated from the voltage generation circuit is applied to the series circuit of the variable resistance element and the load circuit, the variable resistance element showing the third resistance characteristic, with the load resistance characteristic and the voltage generation condition set to the second transition condition, the variable resistance element transits to the second resistance characteristic, when the voltage generated from the voltage generation circuit is applied to the series circuit of the variable resistance element and the load circuit, the variable resistance element showing the second resistance characteristic, with the load resistance characteristic and the voltage generation condition set to a predetermined third transition condition, the variable resistance element transits to the third resistance characteristic, when the voltage generated from the voltage generation circuit is applied to the series circuit of the variable resistance element and the load circuit, the variable resistance element showing the fourth resistance characteristic, with the load resistance characteristic and the voltage generation condition set to the third transition condition, the variable resistance element transits to the third resistance characteristic, when the voltage generated from the voltage generation circuit is applied to the series circuit of the variable resistance element and the load circuit, the variable resistance element showing the first resistance characteristic, with the load resistance characteristic and the voltage generation condition set to a predetermined fourth transition condition, the variable resistance element transits to the fourth resistance characteristic, when the voltage generated from the voltage generation circuit is applied to the series circuit of the variable resistance element and the load circuit, the variable resistance element showing the third resistance characteristic, with the load resistance characteristic and the voltage generation condition set to the fourth transition condition, the variable resistance element transits to the fourth resistance characteristic, and wherein the first and third resistance characteristics show lower resistance state than second and fourth resistance characteristics.

2. The nonvolatile semiconductor memory device according to claim 1,
wherein the load resistance characteristic is in common and only the voltage generation conditions are different between the first and second transition conditions, and
the voltage generation condition is in common and only the load resistance characteristics are different between the first and third transition conditions and between the second and fourth transition conditions.

3. The nonvolatile semiconductor memory device according to claim 1, wherein
the memory cell array comprises
the plurality of memory cells arranged in a row direction and in a column direction, respectively,
a plurality of word lines extending in the row direction, and
a plurality of bit lines extending in the column direction,
in which one ends of the memory cells in the same row are connected to a common word line, and
the other ends of the memory cells in the same column are connected to a common bit line, and
the load circuit is formed outside the memory cell array, and electrically connected to at least one of a selected word line selected from the plurality of word lines and a selected bit line selected from the plurality of bit lines.

4. The nonvolatile semiconductor memory device according to claim 1, wherein
the load circuit has a plurality of polycrystalline silicon bodies showing ohmic characteristics having different resistance values, and
the load resistance characteristic is controllably changed by selecting one polycrystalline silicon body from the plurality of polycrystalline silicon bodies and connecting the selected polycrystalline silicon body to one end of the variable resistance element to form the series circuit.

5. The nonvolatile semiconductor memory device according to claim 1, wherein
the load circuit has an MOS transistor, and
the load resistance characteristic is controllably changed by controlling a voltage applied to a gate electrode of the MOS transistor.

6. The nonvolatile semiconductor memory device according to claim 1, wherein the variable resistance element is made from titanium oxynitride, nickel oxide, or copper oxide.

7. A writing method of a nonvolatile semiconductor memory device according to claim 1, comprising:
setting one transition condition selected from at least three kinds of transition conditions by changing one or both of the load resistance characteristic and the voltage generation condition;
applying the voltage generated from the voltage generation circuit to both ends of the series circuit composed of the variable resistance element and the load circuit in the memory cell to be written under the transition condition; and
changing the resistance characteristic of the variable resistance element to one resistance characteristic related to a storage state after writing,
so that one information state among information having at least three values is written.

8. The nonvolatile semiconductor memory device according claim 2, wherein
the memory cell array comprises
the plurality of memory cells arranged in a row direction and in a column direction, respectively,
a plurality of word lines extending in the row direction, and
a plurality of bit lines extending in the column direction,
in which one ends of the memory cells in the same row are connected to a common word line,
the other ends of the memory cells in the same column are connected to a common bit line, and
the load circuit is formed outside the memory cell array, and electrically connected to at least one of a selected word line selected from the plurality of word lines and a selected bit line selected from the plurality of bit lines.

9. The nonvolatile semiconductor memory device according to claim 2, wherein
the load circuit has a plurality of polycrystalline silicon bodies showing ohmic characteristics having different resistance values, and
the load resistance characteristic is controllably changed by selecting one polycrystalline silica body from the plurality of polycrystalline silicon bodies and connecting the selected polycrystalline silicon body to one end of the variable resistance element to form the series circuit.

10. The nonvolatile semiconductor memory device according to claim 2, wherein
the load circuit has an MOS transistor, and
the load resistance characteristic is controllably changed by controlling a voltage applied to a gate electrode of the MOS transistor.

11. The nonvolatile semiconductor memory device according to claim 2, wherein the variable resistance element is made from titanium oxynitride, nickel oxide, or copper oxide.

12. A writing method of a nonvolatile semiconductor memory device according to claim 2, comprising:
setting one transition condition selected from at least three kinds of transition conditions by changing one or both of the load resistance characteristic and the voltage generation condition;
applying the voltage generated from the voltage generation circuit to both ends of the series circuit composed of the variable resistance element and the load circuit in the memory cell to be written under the transition condition; and
changing the resistance characteristic of the variable resistance element to one resistance characteristic related to a storage state after writing,
so that one information state among information having at least three values is written.

13. The nonvolatile semiconductor memory device according to claim 1, wherein a current-voltage characteristic of the variable resistance element is asymmetric.

14. A non-volatile memory cell array, comprising:
a plurality of word lines arranged in a first direction;
a plurality of ines arranged in a second direction different from the first direction;
a plurality of memory cells arranged between cross points of the word and bit lines, each memory cell comprising
a variable resistance element having a two-terminal structure commprising a variable resistor sandwiched between an upper electrode and a lower electrode; and
a load circuit electriclly connected in series with one terminal of each of the variable resistance elements, the load circuit being configured such that a resistance of the load circuit is switchable among one of a plurality of load resistance characteristics,
wherein the variable resistance element is configured such that its current-voltage characteristic is asymmetric and is confiured such that upon application of a transition condition to a series circuit of the variable resistance element and the load circuit, a resistance of the variable resistance element changes from one of a plurality of resistance characteristics to another of the plurality of resistance characteristics,
wherein the plurality of resistance characteristics comprise first, second, third and fourth resistance characteristics, the resistance of the variable resistance element increasing in order of the first, third, second, and fourth resistance characteristics,
wherein the transition condition is one of a plurality of predetermined transition conditions, each predetermined transition condition being a different combination of the load resistance characteristic of the load circuit, a pulse magnitude, a pulse polarity, and a pulse duration of a voltage pulse applied to both ends of the series circuit,
wherein the polarity of the applied voltage pulse is defined in a direction from the upper electrode to the lower electrode of the variable resistance element,
wherein the plurality of predetermined conditions comprise first, second, third and fourth transition conditions,
the first transition condition being a combination of a first load resistance characteristic of the load circuit, and a first magnitude and a first polarity of the voltage pulse, the first polarity being positive,
the second transition condition being a combination of a second load resistance characteristic of the load circuit, and a second magnitude and a second polarity of the voltage pulse, the second load resistance characteristic being equal to the first load resistance characteristic, the second magnitude being greater than the first magnitude, and the second polarity being negative,
the third transition condition being a combination of a third load resistance characteristic of the load circuit, and a third magnitude and a third polarity of the voltage pulse, the third load resistance characteristic having a higher resistance than the first load resistance characteristic,
the third magnitude being equal to the first magnitude, and the third polarity being positive, and the fourth transition condition being a combination of a fourth load resistance characteristic of the load circuit, and a fourth magnitude and a fourth polarity of the voltage pulse, the fourth load resistance characteristic having a resistance in between the first and third load resistance characteristics, the fourth magnitude being equal to the second magnitude, and the fourth polarity being negative, wherein when the variable resistance element is in the second resistance characteristic, the variable resistance element transits to the first resistance characteristic upon application of the first transition condition, wherein when the variable resistance element is in the fourth resistance characteristic, the variable resistance element transits to the first resistance characteristic upon application of the first transition condition, wherein when the variable resistance element is in the first resistance characteristic, the variable resistance element transits to the second resistance characteristic upon application of the second transition condition, wherein when the variable resistance element is in the third resistance characteristic, the variable resistance element transits to the second resistance characteristic upon application of the second transition condition, wherein when the variable resistance element is in the second resistance characteristic, the variable resistance element transits to the third resistance characteristic upon application of the third transition condition, wherein when the variable resistance element is in the fourth resistance characteristic, the variable resistance element transits to the third resistance characteristic upon application of the third transition condition, wherein when the variable resistance element is in the first resistance characteristic, the variable resistance element transits to the fourth resistance characteristic upon application of the fourth transition condition, and wherein when the variable resistance element is in the third resistance characteristic, the variable resistance element transits to the fourth resistance characteristic upon application of the fourth transition condition.

15. The non-volatile memory cell array according to claim 14, wherein the resistances of the first, second, third and fourth resistance characteristic respectively range between 80-500Ω, 1.3k-32kΩ, 550-2.2kΩ, and 4k-100kΩ, and wherein a minimum separation in resistances between the first and third resistance characteristics, between the third and second resistance characteristics, and between the second and fourth resistance characteristics are respectively 430Ω, 750Ω, and 2kΩ.

16. The non-volatile memory cell array according to claim 14, wherein the pulse duration is the same for all of the first, second, third and fourth transition conditions.

* * * * *